(12) United States Patent
Kim et al.

(10) Patent No.: US 11,615,829 B1
(45) Date of Patent: Mar. 28, 2023

(54) MEMORY DEVICE PERFORMING REFRESH OPERATION BASED ON A RANDOM VALUE AND METHOD OF OPERATING THE SAME

(71) Applicant: SAMSUNG ELECTRONICS CO., LTD., Suwon-si (KR)

(72) Inventors: Dongha Kim, Hwaseong-si (KR); Hyunki Kim, Yongin-si (KR); Hoyoung Song, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/244,261

(22) Filed: Apr. 29, 2021

(51) Int. Cl.
  *G11C 11/406* (2006.01)
  *G11C 11/408* (2006.01)

(52) U.S. Cl.
  CPC ........ *G11C 11/406* (2013.01); *G11C 11/4087* (2013.01)

(58) Field of Classification Search
  CPC .......................... G11C 11/406; G11C 11/4087
  USPC .......................................................... 365/222
  See application file for complete search history.

(56) References Cited

U.S. PATENT DOCUMENTS

| 8,154,939 B2* | 4/2012 | Mochizuki ........... G11C 16/105 |
| | | 365/222 |
| 9,032,141 B2 | 5/2015 | Bains et al. |
| 9,117,544 B2 | 8/2015 | Bains et al. |
| 9,251,885 B2 | 2/2016 | Greenfield et al. |
| 9,997,228 B2 | 6/2018 | Lee et al. |
| 10,262,717 B2 | 4/2019 | Fisch et al. |
| 10,573,370 B2 | 2/2020 | Ito et al. |
| 10,950,289 B2* | 3/2021 | Ito ......................... G11C 11/406 |
| 2004/0081006 A1* | 4/2004 | Takahashi ............. G11C 11/406 |
| | | 365/200 |

* cited by examiner

*Primary Examiner* — Connie C Yoha
(74) *Attorney, Agent, or Firm* — F. Chau & Associates, LLC

(57) ABSTRACT

A memory device includes a memory cell array, a random bit generator, a comparator and a refresh controller. The memory cell array includes a plurality of memory cells coupled to a plurality of word-lines. The random bit generator generates a random binary code having a predetermined number of bits. The comparator compares the random binary code and a reference binary code to output a matching signal based on a result of the comparison. The refresh controller refreshes target memory cells from among the plurality of memory cells based on addresses accessed by a memory controller during a sampling period randomly determined based on the matching signal and a refresh command from the memory controller.

20 Claims, 16 Drawing Sheets

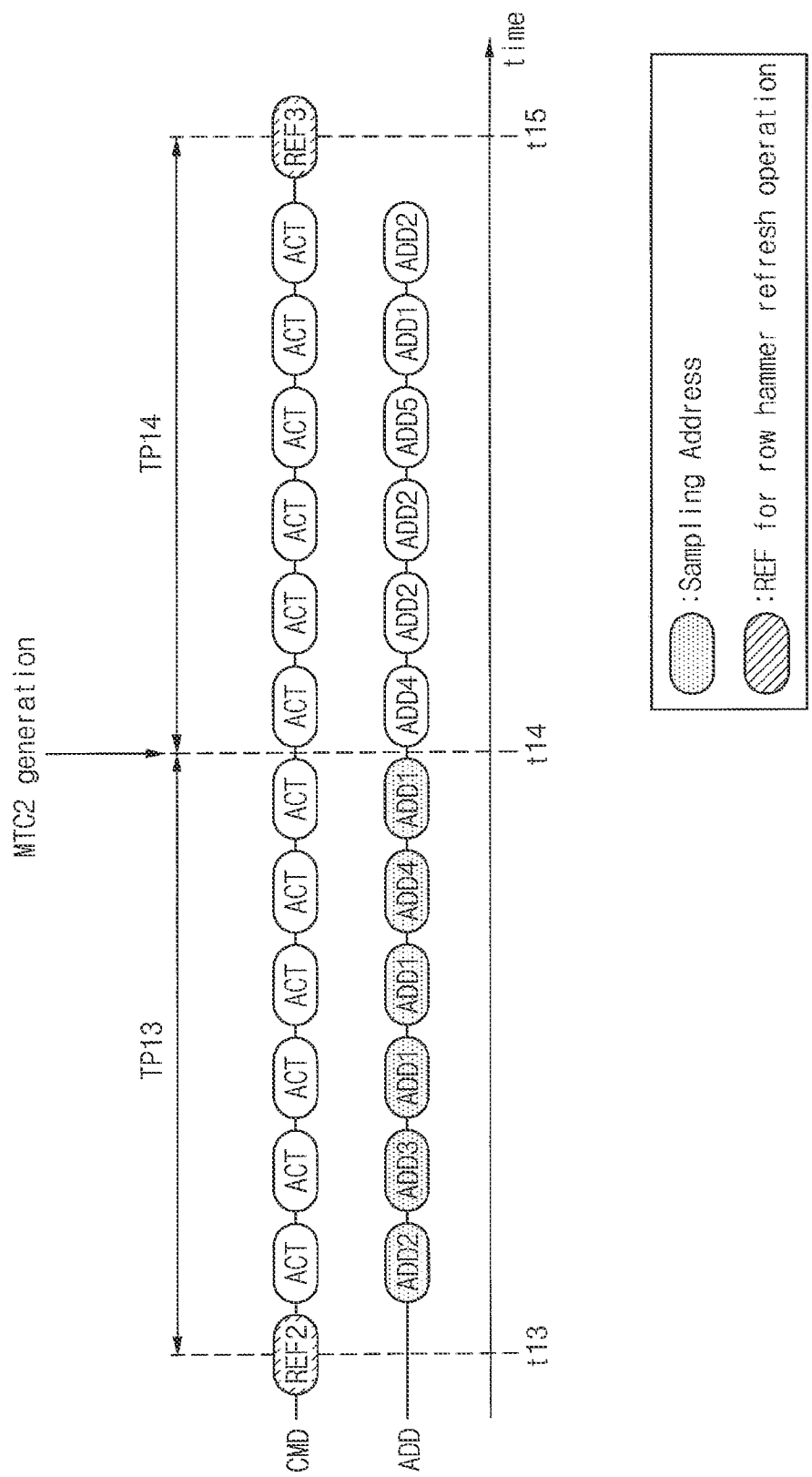

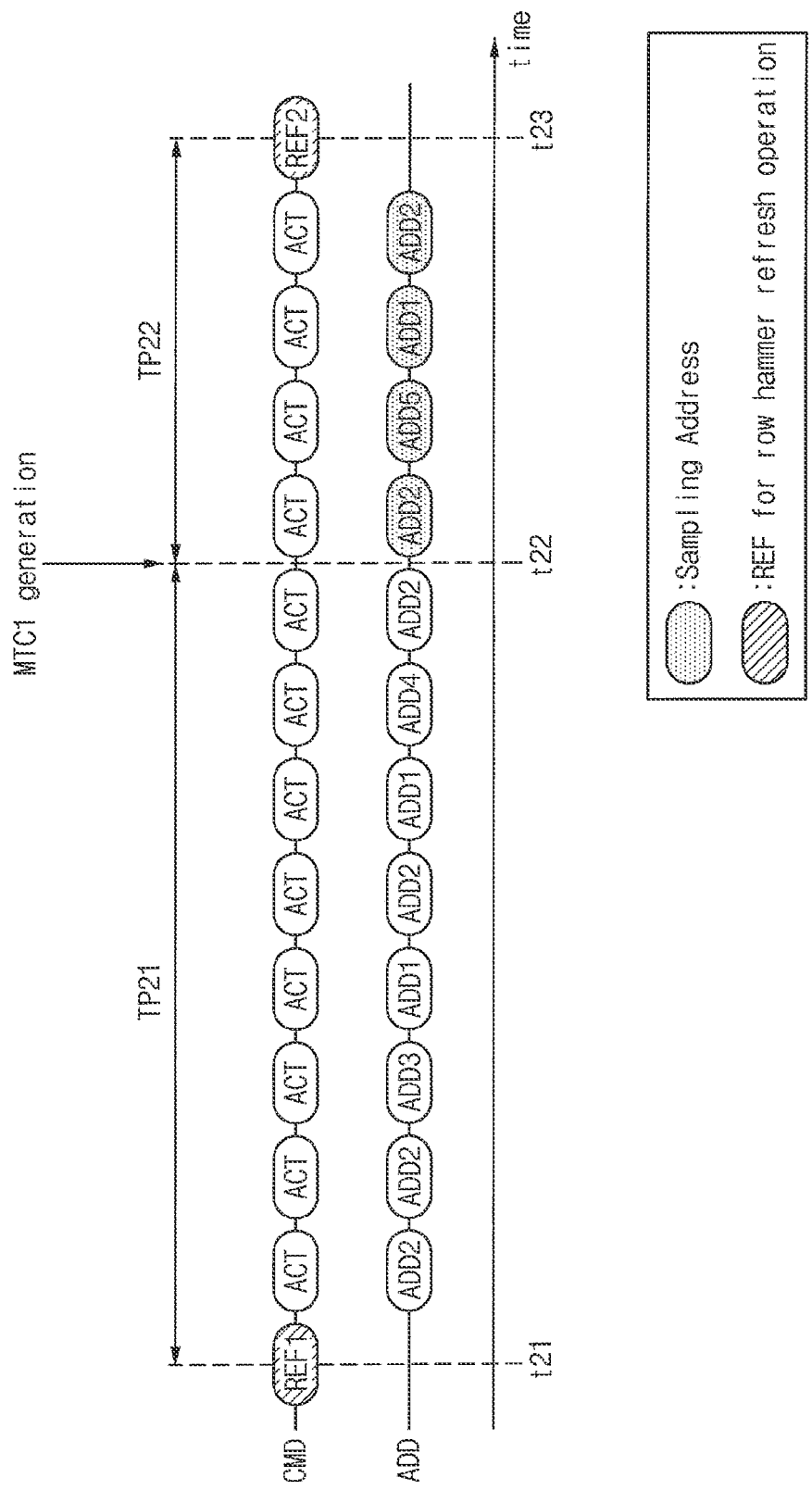

MEMORY DEVICE PERFORMING REFRESH OPERATION BASED ON A RANDOM VALUE AND METHOD OF OPERATING THE SAME

TECHNICAL FIELD

Example embodiments relate to memory devices, and more particularly, to memory devices performing refresh operation and methods of operating the same.

DISCUSSION OF RELATED ART

A dynamic random access memory (DRAM) device may store data by storing a charge to a capacitor of a memory cell connected to a given word-line. The DRAM device may periodically refresh the memory cell since charges in the capacitor leak over time.

The influence of charges of an adjacent memory cell connected to another word-line adjacent to the given word-line increases as processes for manufacturing memory devices are scaled down and periods between word-lines become narrower. When the given word-line (e.g., the active state word-line) is intensively accessed, a row hammer may occur in an adjacent memory cell. That is, due to a voltage of the active state word-line, data stored in the memory cells connected to other word-lines adjacent to the active state word-line may be lost or changed to an unintended state.

SUMMARY

At least one exemplary embodiment of the inventive concept provides a memory device capable of preventing data from being lost due to a specified word-line being intensively accessed.

At least one exemplary embodiment of the inventive concept provides a method of operating a memory device, capable of preventing data from being lost due to a specified word-line being intensively accessed.

According to an exemplary embodiment of the inventive concept, a memory device includes a memory cell array, a random bit generator, a comparator and a refresh controller. The memory cell array includes a plurality of memory cells coupled to a plurality of word-lines. The random bit generator generates a random binary code having a predetermined number of bits. The comparator compares the random binary code and a reference binary code to output a matching signal based on a result of the comparison. The refresh controller refreshes target memory cells from among the plurality of memory cells based on addresses accessed by a memory controller during a sampling period randomly determined based on the matching signal and a refresh command from the memory controller.

According to an exemplary embodiment of the inventive concept, a memory device includes a memory cell array, a control logic circuit and a row decoder. The memory cell array includes a plurality of memory cells coupled to a plurality of word-lines. The control logic circuit generates a refresh address based on first sampling addresses accessed by a memory controller during a first sampling period and second sampling addresses accessed by the memory controller during a second sampling period. The row decoder refreshes target memory cells corresponding to the refresh address, from among the plurality of memory cells. The first sampling period is determined based on a first refresh command from the memory controller and a first matching signal that is randomly generated. The second sampling period is determined based on a second refresh command from the memory controller and a second matching signal that is randomly generated.

According to an exemplary embodiment of the inventive concept, a method of operating a memory device including a plurality of memory cells coupled to a plurality of word-lines is provided. The method includes sampling addresses provided from a memory controller in response to a first refresh command to generate first sample addresses; halting an operation to sample the addresses provided from the memory controller in response to a first matching signal randomly generated after receiving the first refresh command; refreshing first memory cells from among the plurality of memory cells based on a second refresh command and one of the first sample addresses to sample addresses provided from the memory controller after the first matching signal being generated to generate second sample addresses; halting an operation to sample the addresses provided from the memory controller in response to a second matching signal randomly generated after receiving the second refresh command; and refreshing second memory cells from among the plurality of memory cells based on a third refresh command and one of the first sample addresses and the second sample addresses. The third refresh command is provided from the memory controller after the second matching signal being generated.

According to an exemplary embodiment of the inventive concept, a memory device includes a memory cell array, a random number generator, and a refresh controller. The memory cell array includes a plurality of memory cells coupled to a plurality of word-lines. The random number generator is configured to generate a random number. The refresh controller is configured to begin sampling addresses of the memory cell array accessed by the memory controller in response to a first refresh command at a first time, configured to halt the sampling at a second time when the generated random number matches a pre-stored reference number, select an address among the addresses sampled between the first and second times that occurs most frequently, and refresh at least one of the memory cells connected to one of the word-lines associated with an address adjacent the selected address.

Therefore, a memory device according to at least one exemplary embodiment of the inventive concept identifies a target address which is intensively accessed, and refreshes memory cells based on the target address. Accordingly, the memory device may prevent data of memory cells connected to at least one word-line adjacent to the target word-line from being damaged when a target word-line is intensively accessed.

BRIEF DESCRIPTION OF THE DRAWINGS

The present disclosure will become more apparent by describing in detail example embodiments thereof with reference to the accompanying drawings.

FIGS. 7A through 7D illustrate examples of the refresh controller in FIG. 6 determining a sampling period according to an exemplary embodiment of the inventive concept.

DETAILED DESCRIPTION OF THE EMBODIMENTS

Figure 1:
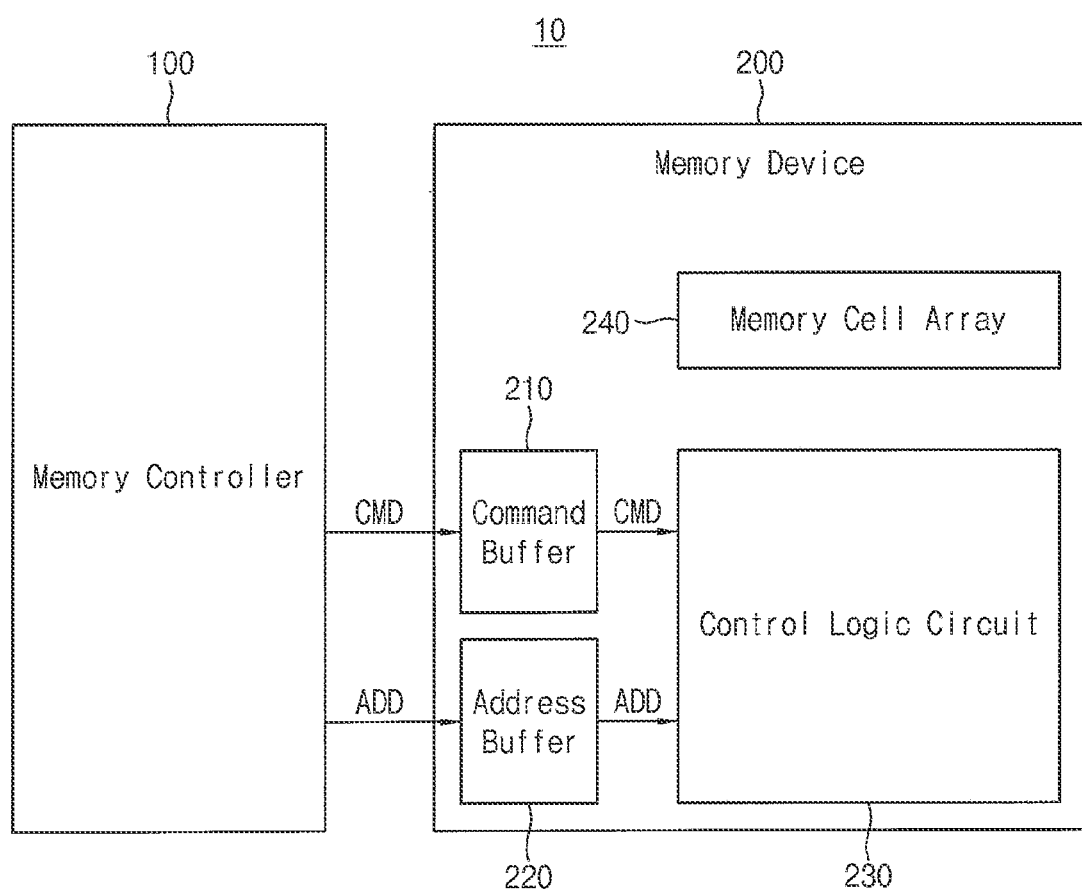
FIG. 1 is a block diagram illustrating a memory system according to an exemplary embodiment of the inventive concept.

Exemplary embodiments of the present inventive concept will be described more fully hereinafter with reference to the accompanying drawings. Like reference numerals may refer to like elements throughout the accompanying drawings.

FIG. 1 is a block diagram illustrating a memory system according to an exemplary embodiment of the inventive concept.

Referring to FIG. 1, a memory system 10 includes a memory controller 100 and a memory device 200.

For example, the memory system 10 may be included or implemented in one of various electronic devices such as a desktop computer, a laptop computer, a workstation, a server, a mobile device, etc.

The memory controller 100 may control an overall operation of the memory device 200. The memory controller 100 may control the overall data exchange between an external host and the memory device 200. For example, the memory controller 100 may write data to the memory device 200 or read data from the memory device 200 in response to a request from the host.

In addition, the memory controller 100 may transmit a command CMD and an address ADD to the memory device 200 for controlling the memory device 200. The memory controller 100 may transmit the command CMD and the address ADDR to the memory device 200 through one channel (the same signal line) or different channels (different signal lines).

The memory controller 100 may be implemented in a host (not illustrated) and may access the memory device 200 according to a request from a processor (not illustrated) in the host. For example, the memory controller 100 may access the memory device 200 in a direct memory access (DMA) manner. The memory controller 100 may be implemented with a portion of a system-on chip (SoC), but is not limited thereto.

The memory device 200 may operate as a buffer memory, a working memory, or a main memory of the host which includes the memory controller 100. The memory device 200 may operate based on the command CMD and the address ADD transmitted by the memory controller 100. For example, the memory device 200 may store data transmitted from the memory controller 100 or may transmit data to the memory controller 100.

The memory device 200 may include a command buffer 210, an address buffer 220, a control logic circuit 230 and a memory cell array 240.

The command buffer 210 may temporarily store the command CMD from the memory controller 100 and may transfer the command CMD to the control logic circuit 230. The address buffer 220 may temporarily store the address ADD from the memory controller 100 and may transfer the address ADD to the control logic circuit 230.

The control logic circuit 230 may receive the command CMD and the address ADD from the command buffer 210 and the address buffer 220, respectively. The control logic circuit 230 may decode the command CMD to generate a decoded result and may control components of the memory device 200 based on the decoded result.

Figure 2:
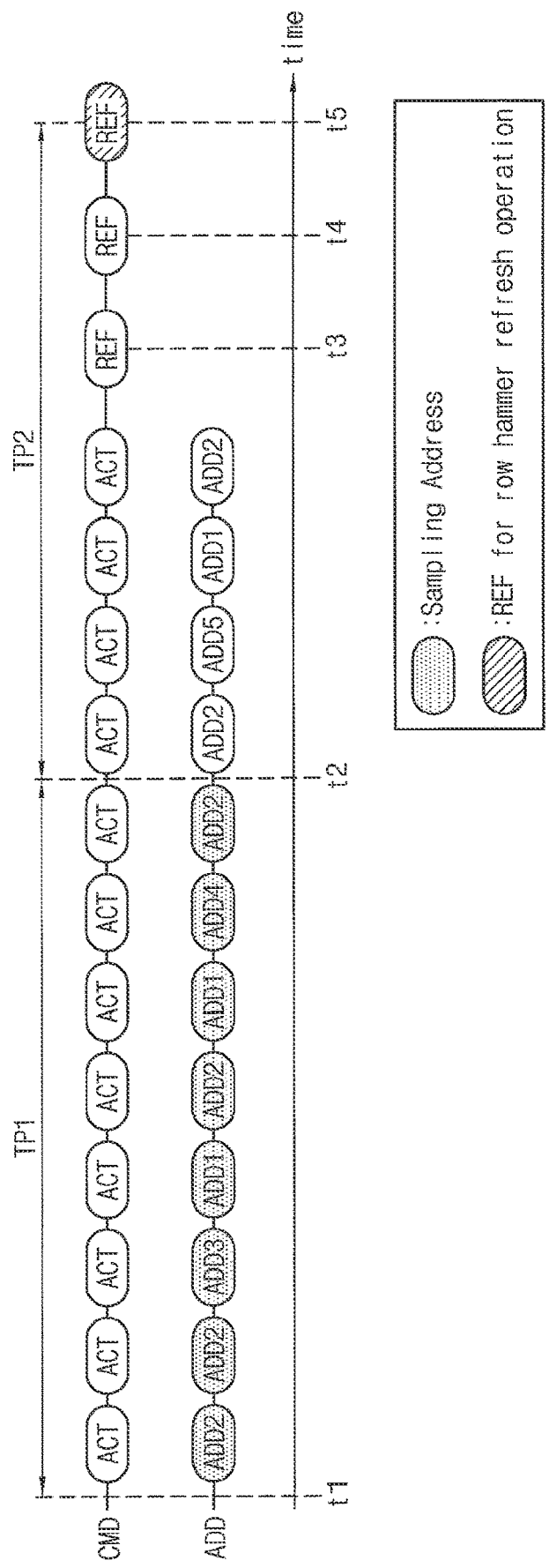
FIG. 2 is a timing diagram illustrating a refresh operation of the memory device according to an exemplary embodiment of the inventive concept.

For example, the control logic circuit 230 may control the components of the memory device 200 to enable a word-line corresponding to (designated by) the address ADD in response to an active command (ACT in FIG. 2). For example, the control logic circuit 230 may control the components of the memory device 200 to refresh memory cells in the memory cell array 240 in response to a refresh command (REF in FIG. 2). In a refresh operation, a plurality of memory cell rows in the memory cell row 240 may be sequentially refreshed or a specified memory cell row is refreshed. Each of the plurality of memory cell rows may include a plurality of memory cells.

The memory cell array 240 may include a plurality of memory cells coupled to a plurality of word-lines and a plurality of bit-lines. For example, each of the plurality of memory cells may be a DRAM cell. The memory controller 100 and the memory device 200 may communicate signals to each other based on a protocol such as double data rate (DDR), low power double data rate (LPDDR), graphics double data rate (GDDR), Wide I/O, high bandwidth memory (HBM) and hybrid memory cube (HMC), but exemplary embodiments of the inventive concept are not limited thereto. The memory cells may be one of memory cells of static random access memory (SRAM), a phase change random access memory (PRAM), a magnetic random access memory (MRAM), a ferroelectric random access memory (FRAM) and a NAND flash memory.

In an exemplary embodiment, a specified address (a target address) is frequently accessed or called by the memory controller 100, from among all addresses of the memory device 200. The number of times that the target address is accessed by the memory controller 100 may be relatively greater than the number of times that any other address of the memory device 200 is accessed by the memory controller 100. However, the above operation of the memory controller 100 may cause a disturbance or coupling with respect to data stored at a location adjacent to a location corresponding to the target address. For example, in a case where frequent, intensive, or iterative activation and deactivation is performed on a word-line corresponding to the target address by the memory controller 100, data of memory cells connected to at least one word-line adjacent to the word-line corresponding to the target address may be damaged.

The control logic circuit 230 may determine a target address which is accessed by the memory controller 100 more frequently than any other address of the memory device 200 and may refresh memory cells coupled to at least one word-line adjacent to the target word-line. Therefore, the memory device 200 may prevent data of memory cells connected to at least one word-line adjacent to the target word-line from being damaged when a target word-line is intensively accessed.

FIG. 2 is a timing diagram illustrating a refresh operation of the memory device according to an exemplary embodiment of the inventive concept.

Referring to FIGS. 1 and 2, the memory device 200 receives active commands ACT and an address ADD corresponding to each of the active commands ACT from the memory controller 100 during a time period from a first time point t1 to a fifth time point t5 including time points t2, t3 and t4. For example, the address ADD may be a row address designating one word-line of the word-lines of the memory device 200. As illustrated in FIG. 2, the memory device 200 may receive one of first through fifth addresses ADD1, ADD2, ADD3, ADD4 and ADD5 in response to one active command ACT from the memory controller 100.

In an exemplary embodiment, the memory device 200 samples addresses provided from the memory controller 100 during a first time period TP1 between the time point t1 and the time point t2 to generate sampled addresses, stores the sampled addresses as sampling addresses in a separate register and manages the sampling addresses. The memory device 200 does not sample addresses provided from the memory controller 100 during a second time period TP2 between the time point t2 and the time point t5. That is, the memory device 200 halts an operation to sample addresses provided from the memory controller 100 after the first time period TP1. Therefore, the memory device 200 may sample the addresses corresponding to eight active commands ACT during the first time period TP1 and does not sample the addresses corresponding to four active commands ACT during the second time period TP2. In this case, the memory device 200 may sample the first through fourth addresses ADD1, ADD2, ADD3 and ADD4.

During the second time period TP2, the memory device 200 receives a refresh command REF from the memory controller 100 at each of the time points t3, t4 and t5 after receiving the active commands ACT. The memory device 200 may perform a refresh operation in response to the refresh command REF.

The memory device 200 may perform a normal refresh operation in response to the refresh command REF at respective one of the third time point t3 and the fourth time point t4. For example, the memory device 200 may sequentially refresh memory cells in one of a plurality of memory banks in the memory device 200 through the normal refresh operation, which is referred to as a per-bank refresh operation, or may sequentially refresh memory cells in all of the plurality of memory banks in the memory device 200 through the normal refresh operation, which is referred to as an all-bank refresh operation.

The memory device 200 may perform a refresh operation based on a selected address from among the sampling address in response to the refresh command REF (which is referred to as a row hammer refresh command, hereinafter) at the fifth time point t5. The row hammer refresh command may be an N-th refresh command from among a plurality of refresh commands received from the memory controller 100. Here, N is an integer greater than one. As illustrated in FIG. 2, the row hammer refresh command may be a third refresh command from among the refresh commands REF.

That is, the row hammer refresh command may be a refresh command which is periodically provided from the memory controller 100.

The memory device 200 may determine a selected address from among the sampling addresses in response to a row hammer refresh command and may perform a refresh operation (which is referred to as a row hammer refresh operation, hereinafter) based on the determined selected address.

For example, the memory device 200 may determine one of the sampling addresses which are sampled during the first time period TP1 before receiving the row hammer refresh command as the selected address. In other example embodiments, the memory device 200 may determine one of the sampling addresses which are sampled during a plurality of time periods including the first time period TP1 as the selected address. The memory device 200 may refresh memory cells coupled to at least one word-line adjacent to a word-line corresponding to the selected word-line.

In an exemplary embodiment of the inventive concept, the memory device 200 randomly determines a time period during which the memory device 200 samples addresses accessed by the memory controller 100. For example, the first time period TP1 and the second time period TP2 may be randomly determined. Determination of a time period for sampling addresses will be described with reference to FIGS. 5 through 7D.

In FIG. 2, the memory device 200 is illustrated as performing the row hammer refresh operation in response to the row hammer refresh command from the memory controller 100, but exemplary embodiments of the inventive concept are limited thereto. The memory device 200 may periodically perform the row hammer refresh operation based on an operation mode even when the memory device 200 does not receive the row hammer refresh command from the memory controller 100. Hereinafter, it is assumed that the memory device 200 performs the row hammer refresh operation in response to the row hammer refresh command from the memory controller 100 for convenience of explanation.

Figure 3:
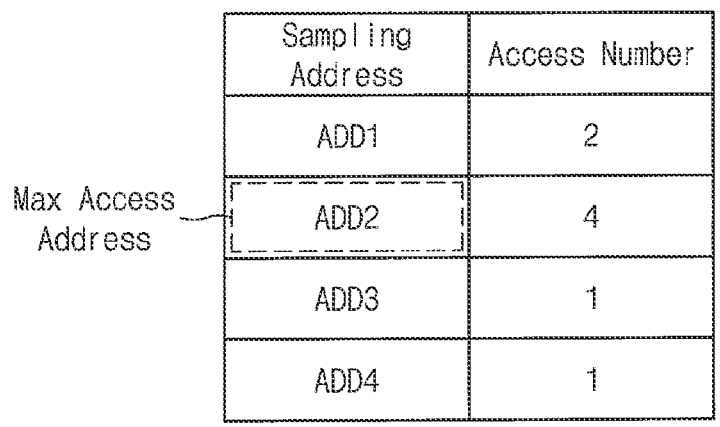
FIG. 3 illustrates an example of selected address associated with performing a refresh operation in FIG. 2.

FIG. 3 illustrates an example of selected address associated with performing a refresh operation in FIG. 2.

Referring to FIGS. 1 through 3, the memory device 200 counts an access number of each of the first through fourth addresses ADD1~ADD4 sampled during the first time period TP1. For example, the control logic circuit 230 may manage or maintain an access number of each of the sampling addresses ADD1~ADD4. As illustrated in FIGS. 2 and 3, an access number of each of the first through fourth addresses ADD1~ADD4 sampled during the first time period TP1 may correspond to '2', '4', '1', and '1' respectively.

The control logic circuit 230 may determine the second address ADD2 whose access number is greatest (i.e., maximum) from among the sampling addresses ADD1~ADD4 as a maximum access address. That is, the second address ADD2 is the maximum access address since the second address ADD2 was accessed more often than the first address ADD1, the third address ADD3, and the fourth address ADD4 during the first time period TP1 (i.e., a sampling period). For example, the control logic circuit may determine a maximum address based on a space saving algorithm, but exemplary embodiments of the inventive concept are not limited thereto. The memory device 200 may determine the maximum access address as a selected address and may perform the row hammer refresh operation based on the maximum access address. For example, the memory device 200 may refresh memory cells coupled to at least one word-line adjacent to a word-line corresponding to the second address ADD2.

As described above, the memory device 200 may sample addresses accessed during a sampling period (i.e., a time period) which is randomly determined in response to the row hammer refresh command, and may perform the row hammer refresh operation based on a maximum access address from among the sampling addresses. In this case, when the memory controller 100 repeatedly accesses the addresses with a regular pattern, the memory device 200 performs the row hammer refresh operation to prevent data from being lost. There, the memory device 200 may enhance data integrity.

Figure 4:
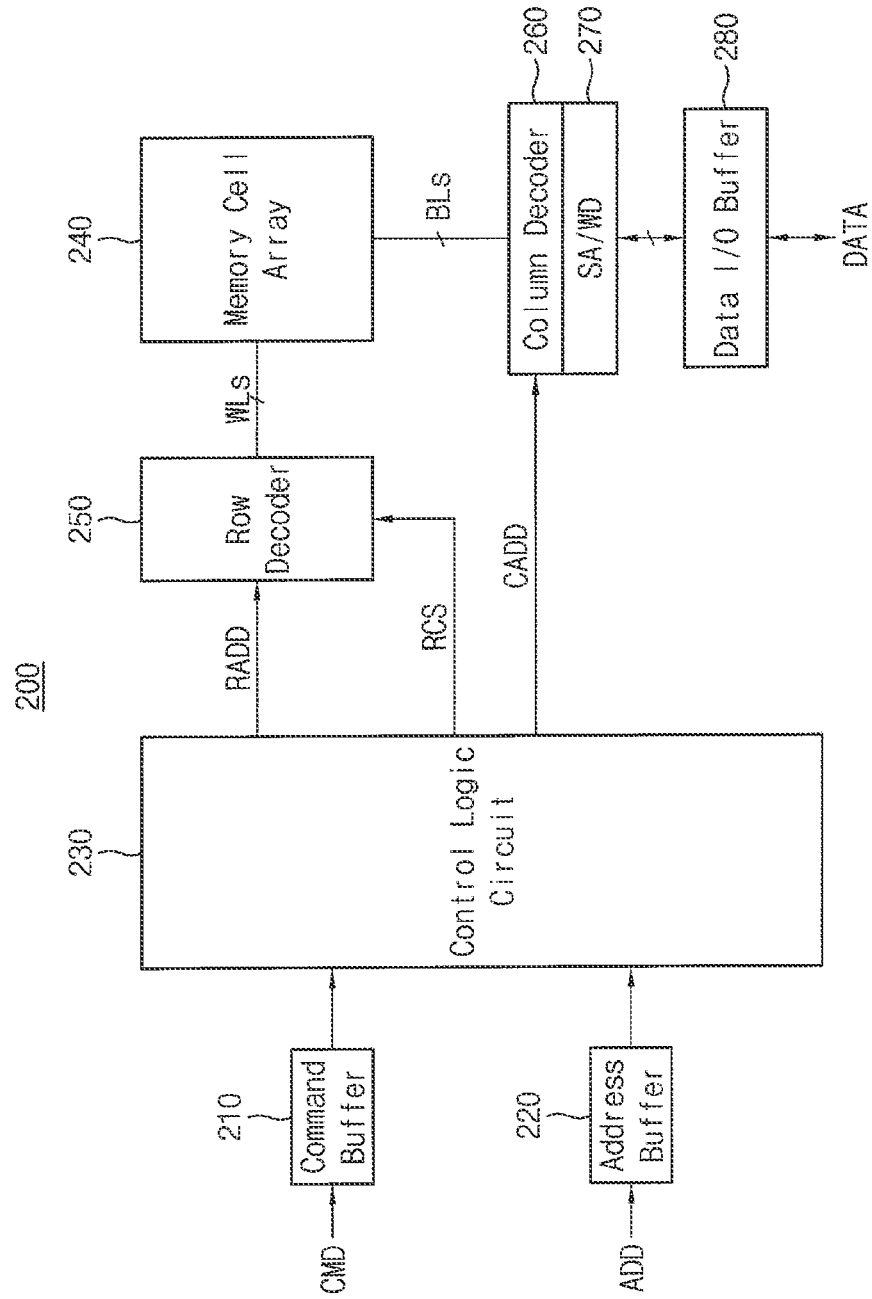
FIG. 4 is a block diagram illustrating an example of the memory device in FIG. 1 according to an exemplary embodiment of the inventive concept.

FIG. 4 is a block diagram illustrating an example of the memory device in FIG. 1 according to an exemplary embodiment of the inventive concept.

Referring to FIG. 4, the memory device 200 may further include a row decoder 250, a column decoder 260, a sense amplifier/write driver 270 and a data input/output (I/O) buffer 280.

The command buffer 210 may transfer the command CMD from the memory controller 100 to the control logic circuit 230 and the address buffer 220 may transfer the address ADD from the memory controller 100 to the control logic circuit 230. In an exemplary embodiment, the address buffer 220 may separate the address ADD into a row address and a column address and may transfer the row address and the column address to the control logic circuit 230.

The control logic circuit 230 may generate control signals for controlling components of the memory device 200 based on the command CMD from the command buffer 210 and the address ADD from the address buffer 220.

For example, the control logic circuit 230 may generate a refresh control signal RCS associated with a refresh operation based on the refresh command REF (in FIG. 2). For example, the control logic circuit 230 may generate a refresh control signal RCS such that a normal refresh operation or a row hammer refresh operation is performed.

The control logic circuit 230 may generate a refresh address RADD corresponding to (designating) a word-line coupled to memory cells to be refreshed. For example, the refresh address RADD, generated for the row hammer refresh operation, may designate at least one word-line adjacent to a word-line corresponding to the maximum access address. In addition, the control logic circuit 230 may generate the refresh address RADD such that memory cell rows are sequentially refreshed in the normal refresh operation.

Although not illustrated, the control logic circuit 230 may include a command decoder that decodes the command CMD and a mode register that sets an operation mode of the memory device 200. In addition, the control logic circuit 230 may further include an address separator that separates the address ADD into a row address and a column address. The control logic circuit 230 may output the refresh address RADD and the column address CADD to the row decoder 250 and the column decoder 260, respectively based on the separated row address and the column address.

The memory cell array 240 may include a plurality of memory cells which are respectively located at points where a plurality of word-lines WLs and a plurality of bit-lines BLs intersect each other.

The row decoder 250 may be coupled to the memory cell array 240 through the word-lines WLs. The row decoder 250 may control voltages of the word-lines WLs under control of the control logic circuit 230. For example, the row decoder 250 may refresh memory cells coupled to a word-line corresponding to the refresh address RADD by enabling and disabling the word-line corresponding to the refresh address RADD based on the refresh address RADD and the refresh control signal RCS.

The column decoder 260 may be coupled to the memory cell array 240 through the bit-lines BLs. The column decoder 260 may select one of the bit-lines BLs under control of the control logic circuit 230. For example, the column decoder 260 may select a bit-line corresponding to the column address CADD from the control logic circuit 230.

The sense amplifier/write driver 270 may receive a write data from the data I/O buffer 280 and may store the write data in memory cells selected by the row decoder 250 and the column decoder 260. The sense amplifier/write driver 270 may read data from the memory cells selected by the row decoder 250 and the column decoder 260 and may provide the read data to the data I/O buffer 280.

The data I/O buffer 280 may temporarily read data provided from the sense amplifier/write driver 270 and write data provided from an outside source such as a host device. The data I/O buffer 280 may provide the read data to the memory controller 100 in FIG. 1, or may receive the write data to provide the write data to the sense amplifier/write driver 270.

Figure 5:
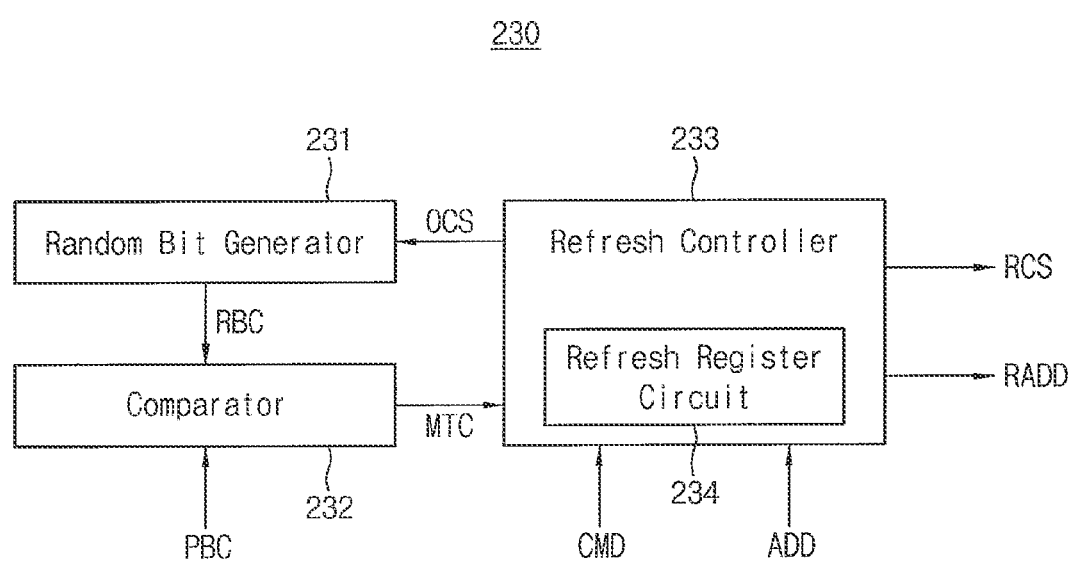
FIG. 5 is a block diagram illustrating an example of the control logic circuit in FIG. 4 according to an exemplary embodiment of the inventive concept.

FIG. 5 is a block diagram illustrating an example of the control logic circuit in FIG. 4 according to an exemplary embodiment of the inventive concept.

Referring to FIG. 5, the control logic circuit 230 includes a random bit generator 231 (e.g., a logic circuit), a comparator 232 (e.g., a comparison circuit) and a refresh controller 233 (e.g., a control circuit).

The random bit generator 231 may generate a random binary code RBC having a predetermined number of bits. The random binary code RBC may be a pseudo random sequence. That is, the random bit generator 231 may generate the random binary code RBC based on the pseudo random sequence. The random bit generator 231 may output the random binary code RBC to the comparator 232 in response to an output control signal OCS from the refresh controller 233.

The refresh controller 233 may output the output control signal OCS to the random bit generator 231 based on the command CMD. For example, the refresh controller 233 may provide the output control signal OCS to the random bit generator 231 whenever the refresh controller 233 receives the active command ACT (in FIG. 2).

That is, the random bit generator 231 may output the random binary code RBC in response to the active command ACT. For example, the random bit generator 231 may output a first random binary code in response to a first active command and may output a second random binary code in response to a second active command. When the random binary code RBC is a pseudo random sequence, the random binary code RBC, output from the random bit generator 231 according to the active command ACT may be periodically repeated.

In an exemplary embodiment, the comparator 232 compares the random binary code RBC and a pre-stored reference binary code PBC to output a matching signal MTC based on a result of the comparison. The reference binary code PBC may be the same as at least one of values of the random binary code RBC that the random bit generator 231 is capable of outputting. For example, the reference binary code PBC may be provided from an external register or may be stored in a register in the comparator 232. When bits of the random binary code RBC are the same as bits of the reference binary code PBC (i.e., when the random binary code RBC matches the reference binary code PBC), the comparator 232 may output the matching signal MTC to the refresh controller 233. For example, when the random binary code RBC is periodically repeated, the comparator 232 may output the matching signal MTC which is periodically repeated based on the random binary code RBC. In an exemplary embodiment, the comparator 232 outputs the matching signal MTC at a first logic level when the random binary code RBC matches the reference binary code PBC and outputs the matching signal MTC at a second other logic level when the random binary code RBC does not match the reference binary code PBC.

In example embodiments, the comparator 232 may compare the random binary code RBC with a plurality of reference binary codes PBC. In this case, a frequency of generating the matching signal MTC may vary according to a number of the reference binary codes PBC. For example, a frequency of generating the matching signal MTC may increase as the number of the reference binary codes PBC increases.

The refresh controller 233 may receive the command CMD, the address ADD and the matching signal MTC. The refresh controller 233 may generate the refresh control signal RCS and the refresh address RADD based on the refresh command REF.

For example, when the refresh controller 233 receives the row hammer refresh command, the refresh controller 233 may generate the refresh address RADD such that the row hammer refresh operation is performed in response to the row hammer refresh command. For example, the refresh address RADD may designate at least one word-line adjacent to a word-line corresponding to the maximum access word-line. In an exemplary embodiment, the refresh controller 233 generates the refresh address RADD such that the normal refresh operation is performed in response to the refresh command except the row hammer refresh command.

The refresh controller 233 may determine a sampling period corresponding to a time period (for example, the first time period TP1 in FIG. 2) during which the control logic circuit 230 samples the address ADD and a non-sampling period corresponding to a time period (for example, the second time period TP2 in FIG. 2) during which the control logic circuit 230 halts an operation to sample addresses ADD based on the matching signal MTC and a command CMD. Determination of the sampling period by the refresh controller 233 will be described with reference to FIGS. 7A through 7D.

The refresh controller 233 may store addresses accessed during the sampling period in a refresh register circuit 234 including a plurality of refresh registers. The refresh controller 233 may select a refresh register to store the address ADD based on values of the address ADD.

For example, the refresh controller 233 may store a first address ADD1 (refer to FIG. 7A) in a first refresh register, and may store a second address ADD2 (refer to FIG. 7A) in a second refresh register. When the refresh controller 233 receives a specified address repeatedly during the sampling period, the refresh controller 233 may increase a counting value corresponding to a refresh register storing the specified address. The refresh controller 233 may maintain counting values corresponding to the refresh registers based on the address ADD accessed during the sampling period.

The refresh controller 233 may determine an address stored in a refresh register corresponding to a maximum counting value, from among the refresh registers corresponding to the counting values, respectively, as the maximum access address, which will be described with reference to FIG. 8.

Figure 6:
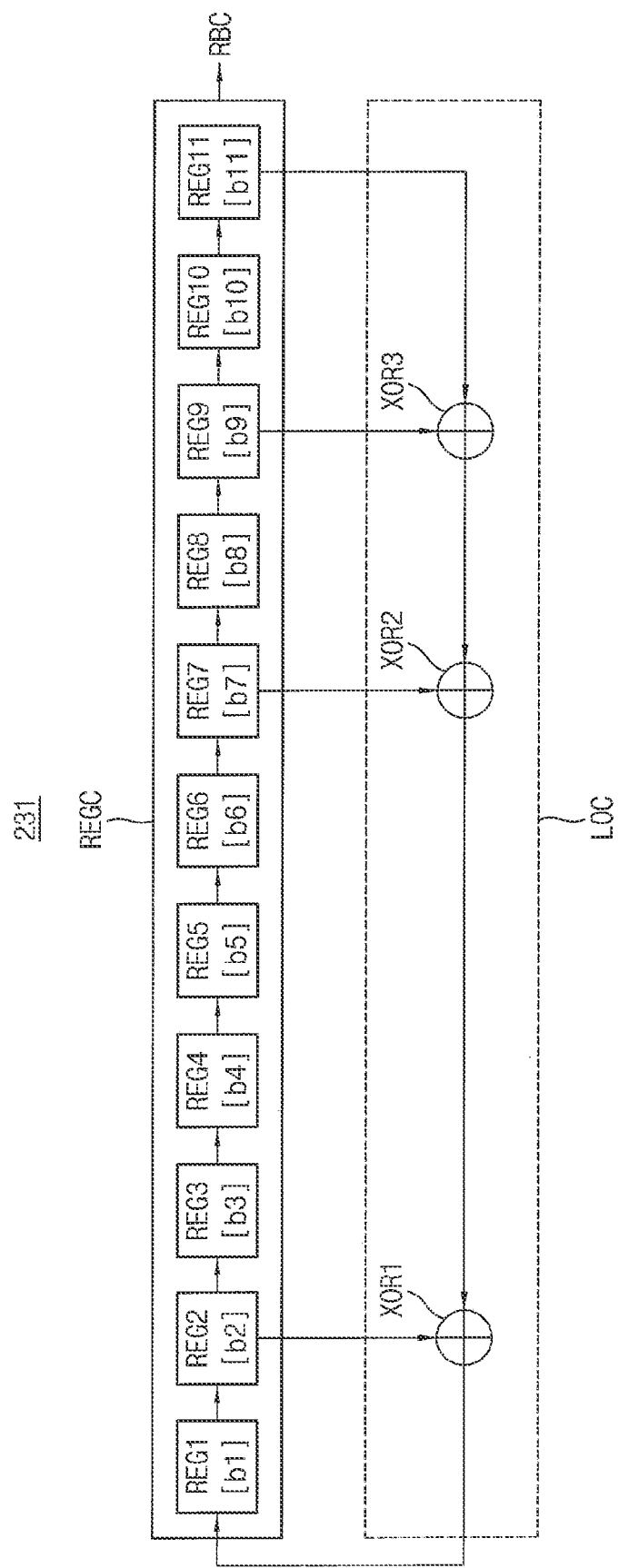
FIG. 6 is a circuit diagram illustrating an example of a random bit generator in FIG. 5 according to an exemplary embodiment of the inventive concept.

FIG. 6 is a circuit diagram illustrating an example of the random bit generator in FIG. 5 according to an exemplary embodiment of the inventive concept.

Referring to FIG. 6, the random bit generator 231 includes a register circuit REGC and a logical operation circuit LOC.

In an exemplary embodiment, the random bit generator 231 is implemented with a linear feedback shift register. That is, the register circuit REGC and the logical operation circuit LOC may constitute a linear feedback shift register.

The linear feedback shift register may determine feedback bits based on a characteristic polynomial having a coefficient of '0' or '1'. The feedback bits are output through a feedback path of the linear feedback shift register. Bits generated by a logical operation based on the feedback bits may be input to input terminals of the linear feedback shift register. The linear feedback shift register may generate a pseudo random sequence based on the bits input to the input terminals.

For example, when the random bit generator 231 is implemented based on a characteristic polynomial of $x^{11}+x^9+x^7+x^2+1$ as illustrated in FIG. 6, the register circuit REGC may include first through eleventh registers REG1~REG11 and the logical operation circuit LOC may include first through third logic circuits XOR1~XOR3.

For example, each of the first through eleventh registers REG1~REG11 may store a respective one of first through eleventh bits b1~b11. Values of the first through eleventh bits b1~b11 may vary according to a shift operation. Each of the first through third logic circuits XOR1~XOR3 may perform an exclusive OR operation.

The random bit generator 231 may output the random binary code RBC through the register circuit REGC. The random bit generator 231 may output the random binary code RBC having a predetermined number of bits. For example, the random bit generator 231 may output the random binary code RBC having four bits based on the first through fourth bits b1~b4 stored in the first through fourth registers REG1~REG4.

The logical operation circuit LOC may be positioned in a feedback path of the random bit generator 231. The first logical circuit XOR1 is positioned in output path of the second register REG2, the second logical circuit XOR2 is positioned in output path of the seventh register REG7 and the third logical circuit XOR3 is positioned in output paths of the ninth register REG9 and the eleventh register REG11.

For example, the third logical circuit XOR3 performs a logical operation based on the ninth bit b9 in the ninth register REG9 and the eleventh bit b11 in the eleventh register REG11. The second logical circuit XOR2 performs a logical operation based on the seventh bit b7 in the seventh register REG7 and an output of the third logical circuit XOR3. The first logical circuit XOR1 performs a logical operation based on the second bit b2 in the second register REG1 and an output of the second logical circuit XOR2.

The output of the first logical circuit XOR1 may vary based on the second bit b2, the seventh bit b7, the ninth bit b9 and the eleventh bit b11. That is, each of the second bit b2, the seventh bit b7, the ninth bit b9 and the eleventh bit b11 may be a feedback bit. The output of the output of the first logical circuit XOR1 may be provided to the first register REG1 as an input.

The first register REG1 may store the output of the first logical circuit XOR1 as the first bit b1. The bit input through a feedback path may be shifted through the first through eleventh registers REG1~REG11 based on a control signal (for example, the output control signal OCS in FIG. 5). For example, the random bit generator 231 performs a bit shift operation based on the output control signal OCS and may output the random binary code RBC based on the first through fourth bits b1~b4 stored in the first through fourth registers REG1~REG4.

As described above, the random bit generator 231 may be implemented with a linear feedback shift register, and the random binary code RBC may be a pseudo random sequence. Therefore, the random bit generator 231 may output the random binary code RBC which is periodically repeated.

While the random bit generator 231 of FIG. 6 is described based on a characteristic polynomial of $x^{11}+x^9+x^7+x^2+1$, exemplary embodiments of the inventive concept are not limited thereto. The random bit generator 231 is implemented based on one of various characteristic polynomials and a number of registers in the register circuit REGC and a number of logical circuits in the logical operation circuit LOC may be varied.

FIGS. 7A through 7D illustrate examples of the refresh controller in FIG. 6 determining a sampling period according to exemplary embodiments of the inventive concept.

Figure 7A:
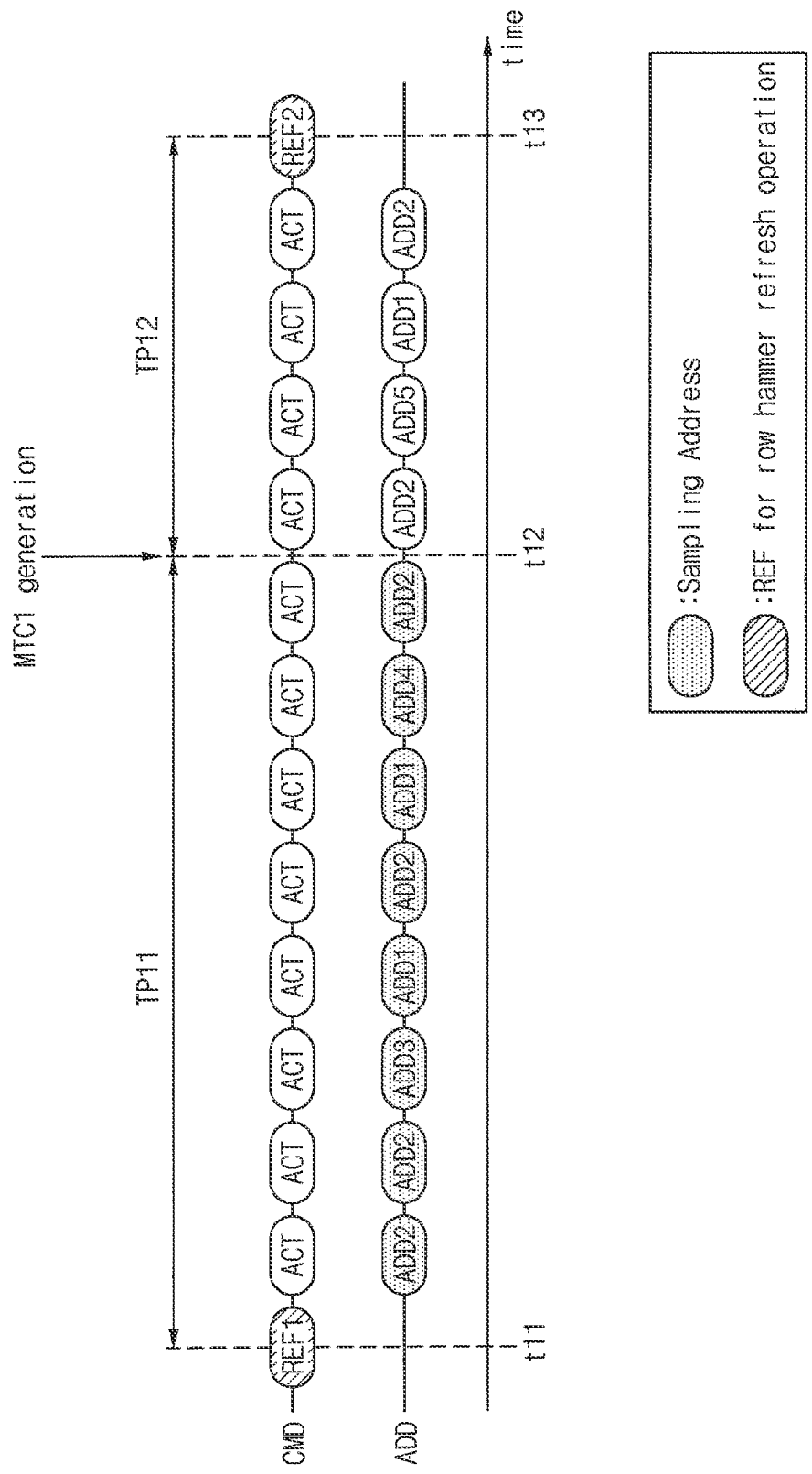
Figure 7D:
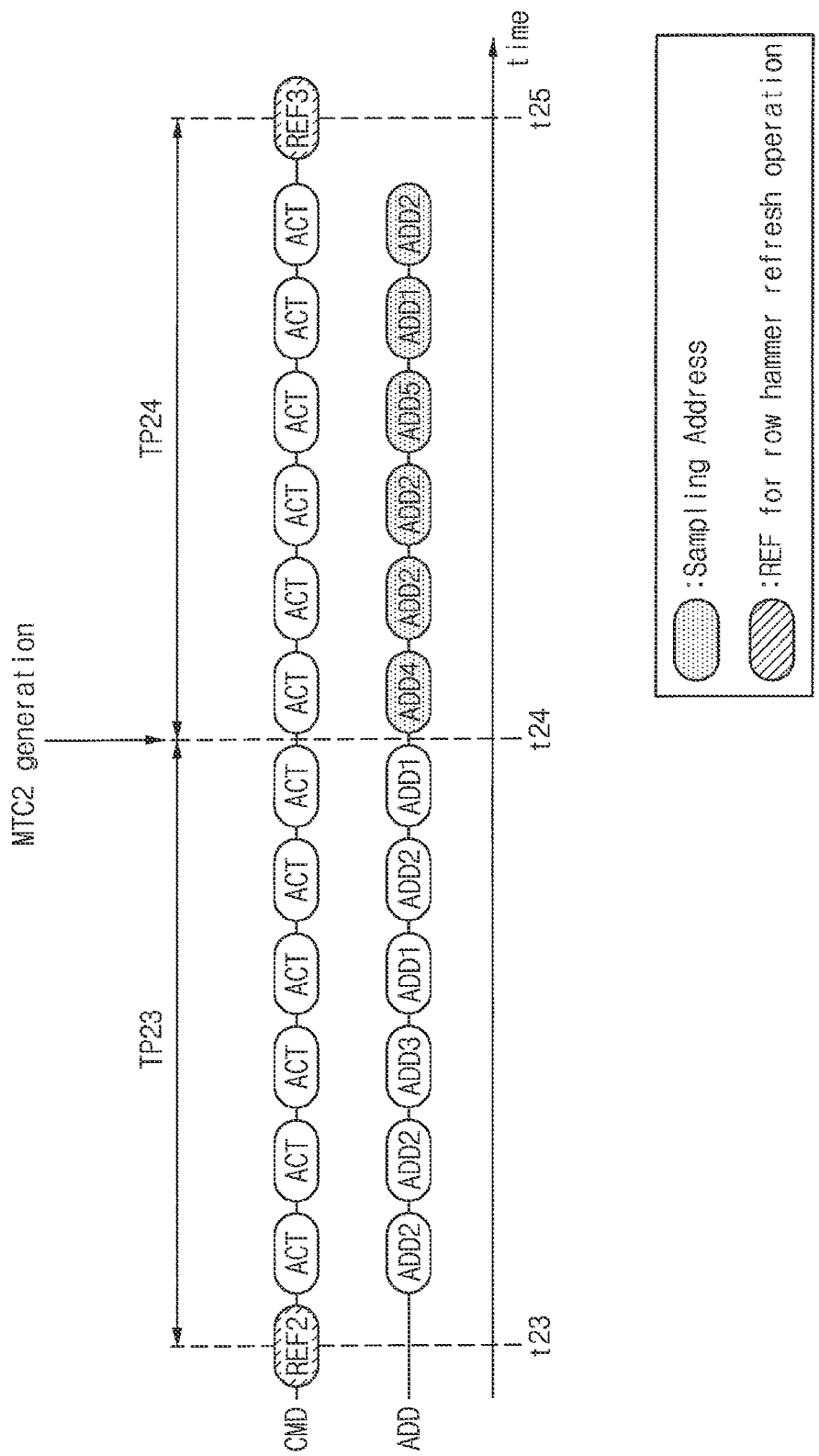

FIGS. 7A and 7B illustrate an example where the refresh controller in FIG. 6 determines a sampling period according to a first scheme and FIGS. 7C and 7D illustrate an example where the refresh controller in FIG. 6 determines a sampling period according to a second scheme.

Referring to, FIGS. 5 and 7A, the refresh controller 233 receives a first refresh command REF1 from the memory controller 100 at a first time point tn. The first refresh command REF1 may be a row hammer refresh command (i.e., an N-th refresh command). The refresh controller 233 may sample addresses ADD received from the memory controller 100 in response to the first refresh command REF1. The refresh controller 233 may sample addresses ADD received from the memory controller 100 in response to the active command CMD after the refresh controller 233 receives the first refresh command REF1.

The refresh controller 233 receives a first matching signal MTC1 provided from the comparator 232 at a second time point t12. The refresh controller 233 halts an operation to sample addresses ADD received from the memory controller 100 in response to the first matching signal MTC1. Therefore, the refresh controller 233 may sample the addresses ADD received from the memory controller 100 during a first time period TP11 and does not sample the addresses ADD received from the memory controller 100 during a second time period TP12. For example, the refresh controller 233 receiving a first matching signal MTC1 of a first logic level may indicate that a current generated random binary code RBC matches a pre-stored binary code PBC and the refresh controller 233 receiving a first matching signal MTC1 of a second other logic level may indicate that the current generated random binary code RBC does not match the pre-stored reference binary code PBC.

For example, as illustrated in FIG. 7A, the refresh controller 233 samples eight addresses ADD received from the memory controller 100 during the first time period TP11 and does not sample four addresses ADD received from the memory controller 100 during the second time period TP12. The refresh controller 233 halts an operation to sample the addresses ADD received from the memory controller 100 in response to the active command ACT after the first matching signal MTC1 is generated.

The refresh controller 233 receives a second refresh command REF2 from the memory controller 100 at a third time point t13. The second refresh command REF2 may be a row hammer refresh command. The refresh controller 233 may determine a maximum access address based on the addresses sampled during the first time period TP11 in response to the second refresh command REF2.

Referring to, FIGS. 5 and 7B, the refresh controller 233 samples addresses ADD received from the memory controller 100 in response to the second refresh command REF2. The refresh controller 233 may sample the addresses ADD received from the memory controller 100 in response to the active command CMD after the refresh controller 233 receives the second refresh command REF2.

The refresh controller 233 may receive a second matching signal MTC2 provided from the comparator 232 at a second time point t14. The refresh controller 233 halts an operation to sample addresses ADD received from the memory controller 100 in response to the second matching signal MTC2. Therefore, the refresh controller 233 may sample the addresses ADD received from the memory controller 100 during a third time period TP13 and does not sample the addresses ADD received from the memory controller 100 during a fourth time period TP14. For example, as illustrated in FIG. 7B, the controller 233 samples six addresses ADD received from the memory controller 100 during the third time period TP13 and does not sample six addresses ADD received from the memory controller 100 during the fourth time period TP14.

The refresh controller 233 receives a third refresh command REF3 from the memory controller 100 at a third time point t15. The third refresh command REF3 may be a row hammer refresh command. The refresh controller 233 may determine a maximum access address based on the addresses sampled during the first time period TP11 and the third time period TP13 in response to the third refresh command REF3.

As described with reference to FIGS. 7A and 7B, the sampling period and/or a number of sampling addresses may be randomly determined based on a generation timing of the matching signal MTC. A period of the first time period TP11 (the first sampling period) determined based on the first matching signal MTC1 may be different from a period of the third time period TP13 (the second sampling period) determined based on the second matching signal MTC2. For example, a number of first sampling addresses (eight) determined based on the first matching signal MTC1 may be different from a number of second sampling addresses (six) determined based on the second matching signal MTC2.

In FIGS. 7C and 7D, commands, addresses and matching signals correspond to the commands, addresses and matching signals in FIGS. 7A and 7B, and thus repeated description will be omitted.

Referring to, FIGS. 5 and 7C, the refresh controller 233 receives the first refresh command REF1 from the memory controller 100 at a first time point t21. The refresh controller 233 does not sample addresses ADD received from the memory controller 100 in response to the first refresh command REF1. The refresh controller 233 receives the first matching signal MTC1 at a second time point t22. The refresh controller 233 samples the addresses ADD received from the memory controller 100 in response to the first matching signal MTC1. Therefore, the refresh controller 233 does not sample eight addresses ADD received from the memory controller 100 during a first time period TP21 and samples four addresses ADD received from the memory controller 100 during a second time period TP22.

The refresh controller 233 samples the addresses ADD received from the memory controller 100 in response to the active command ACT after the first matching signal MTC1 is generated. The refresh controller 233 receives the second refresh command REF2 from the memory controller 100 at a third time point t23. The refresh controller 233 may determine a maximum access address based on the addresses sampled during the second time period TP22 in response to the second refresh command REF2.

Referring to, FIGS. 5 and 7D, the refresh controller 233 does not sample addresses ADD received from the memory controller 100 in response to the second refresh command REF2.

The refresh controller 233 receive the second matching signal MTC2 provided from the comparator 232 at a second time point t24. The refresh controller 233 sample the addresses ADD received from the memory controller 100 in response to the second matching signal MTC2. Therefore, the refresh controller 233 does not sample six addresses ADD received from the memory controller 100 during a third time period TP23 and samples six addresses ADD received from the memory controller 100 during a fourth time period TP24 as illustrated in FIG. 7D. The refresh controller 233 receives the third refresh command REF3 from the memory controller 100 at a third time point t25. The refresh controller 233 may determine a maximum access address based on the addresses sampled during the second time period TP22 and the fourth time period TP24 in response to the third refresh command REF3.

As described with reference to FIGS. 7A through 7D, the refresh controller 233 may determine a sampling period based on the matching signal MTC and the refresh command REF. The sampling period and/or a number of sampling addresses may be randomly determined based on a generation timing of the matching signal MTC.

Determining a sampling period based on the matching signal MTC and the refresh command REF is not limited to the examples shown in FIGS. 7A through 7D, and the refresh controller 233 may determine a sampling period based on various schemes. For example, in an exemplary embodiment, the refresh controller 233 samples the addresses in response to the row hammer refresh command and does not sample the addresses when three matching signals MTC are received.

Figure 8:
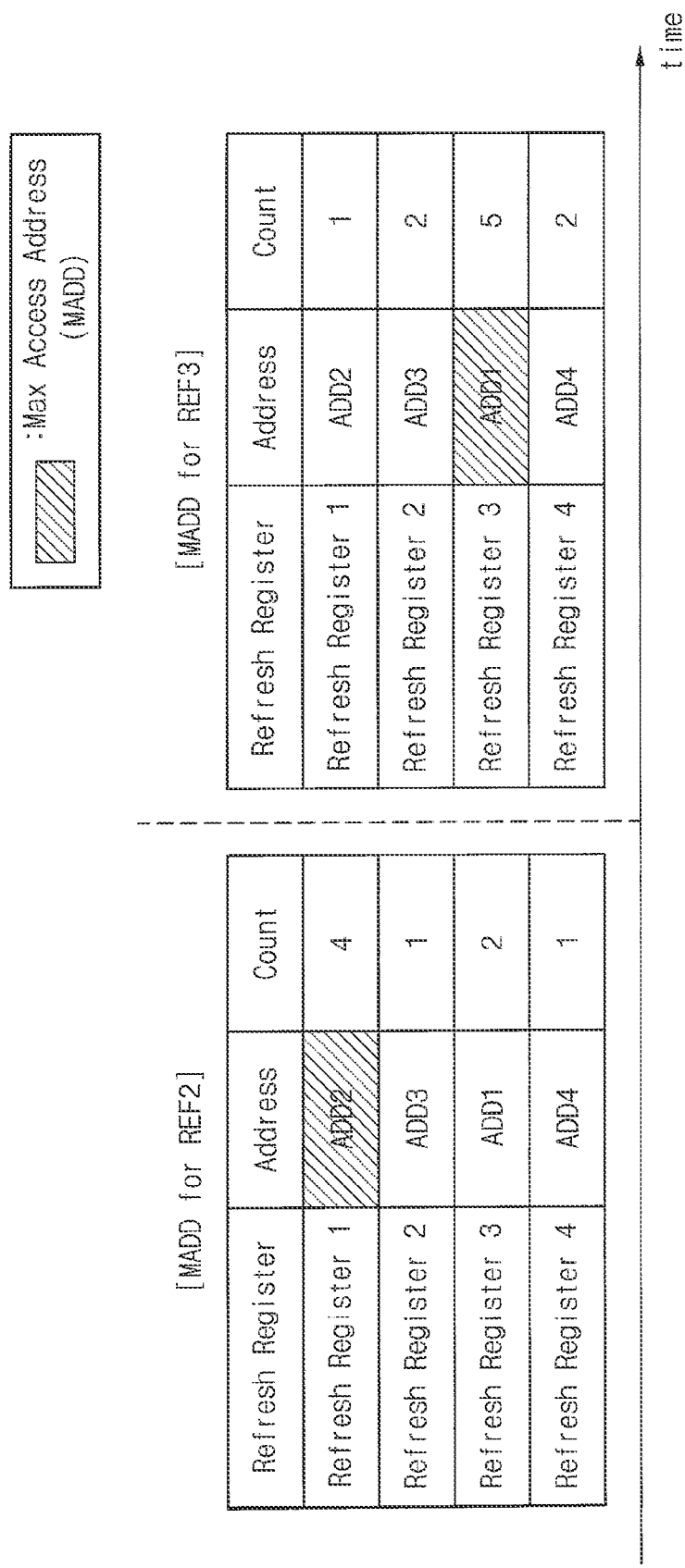
FIG. 8 illustrates an example in which the refresh controller in FIG. 5 determines a maximum access address.

FIG. 8 illustrates an example in which the refresh controller in FIG. 5 determines a maximum access address.

FIG. 8 illustrates an example in which the refresh controller 233 in FIG. 5 determines a maximum access address MADD based on each of the second refresh command REF2 in FIG. 7A and the third refresh command REFS in FIG. 7B.

Referring to, FIGS. 5, 7A and 8, the refresh controller 233 samples eight addresses ADD received from the memory controller 100 during the first time period TP11 by using the refresh register circuit 234.

For example, the refresh controller 233 may store the second address ADD2, received at a first time, in a first refresh register in the refresh register circuit 234. The refresh controller 233 may increase a counting value corresponding to the first refresh register to '1'. The refresh controller 233 may increase the counting value corresponding to the first refresh register to '2' based on the second address ADD2 received at a second time. The refresh controller 233 may store the third address ADD3, received at a third time, in a second refresh register in the refresh register circuit 234. The refresh controller 233 may increase a counting value corresponding to the second refresh register to '1'.

Similarly, the refresh controller 233 may store the first address ADD1 and the fourth address ADD4, in a third refresh register and a fourth refresh register in the refresh register circuit 234, respectively.

Since the refresh controller 233 receives the first address ADD1 two times, the second address ADD2 four times, the third address ADD2 once and the fourth address ADD4 once during the first time period TP11, the refresh controller 233 may set the counting value corresponding to the first refresh register to '4', the counting value corresponding to the second refresh register to '2', the counting value corresponding to the third refresh register to '1', and the counting value corresponding to the fourth refresh register to '1', respectively. The refresh controller 233 may determine the second address ADD2 in the first refresh register, corresponding to a maximum counting value, as the maximum access address MADD in response to the second refresh command REF2.

The refresh controller 233 generates the refresh address RADD based on the second address ADD2 which is determined as the maximum access address MADD. Therefore, the refresh controller 233 may perform the row hammer refresh operation based on the second address ADD2. The counting value corresponding to the first refresh register may be reset to '0' after the row hammer refresh operation is performed.

Referring to, FIGS. 5, 7B and 8, after the counting value corresponding to the first refresh register is reset to '0', the refresh controller 233 may sample six addresses ADD received from the memory controller 100 during the third time period TP13 by using the refresh register circuit 234.

The refresh controller 233 may set the counting value corresponding to the first refresh register to '1' based on the second address ADD2 received at a first time. The refresh controller 233 may increase the counting value corresponding to the second refresh register by '1' to set the counting value corresponding to the second refresh register to '2' based on the third address ADD3 received at a second time. The refresh controller 233 may increase the counting value corresponding to the third refresh register by '3' to set the counting value corresponding to the third refresh register to '5' based on the first address ADD1 received at third, fourth, and sixth times. The refresh controller 233 may increase the counting value corresponding to the fourth refresh register by '1' to set the counting value corresponding to the fourth refresh register to '2' based on the fourth address ADD4 received at a fifth time. The refresh controller 233 may determine the first address ADD1 in the third refresh register, corresponding to a maximum counting value, as the maximum access address MADD in response to the third refresh command REFS.

The refresh controller 233 may generate the refresh address RADD based on the first address ADD1 which is determined as the maximum access address MADD. Therefore, the refresh controller 233 may perform the row hammer refresh operation based on the second address ADD2 since the second address ADD2 is adjacent the maximum access address MADD of the first address ADD1. The counting value corresponding to the third refresh register may be reset to '0' after the row hammer refresh operation is performed.

Figure 9:
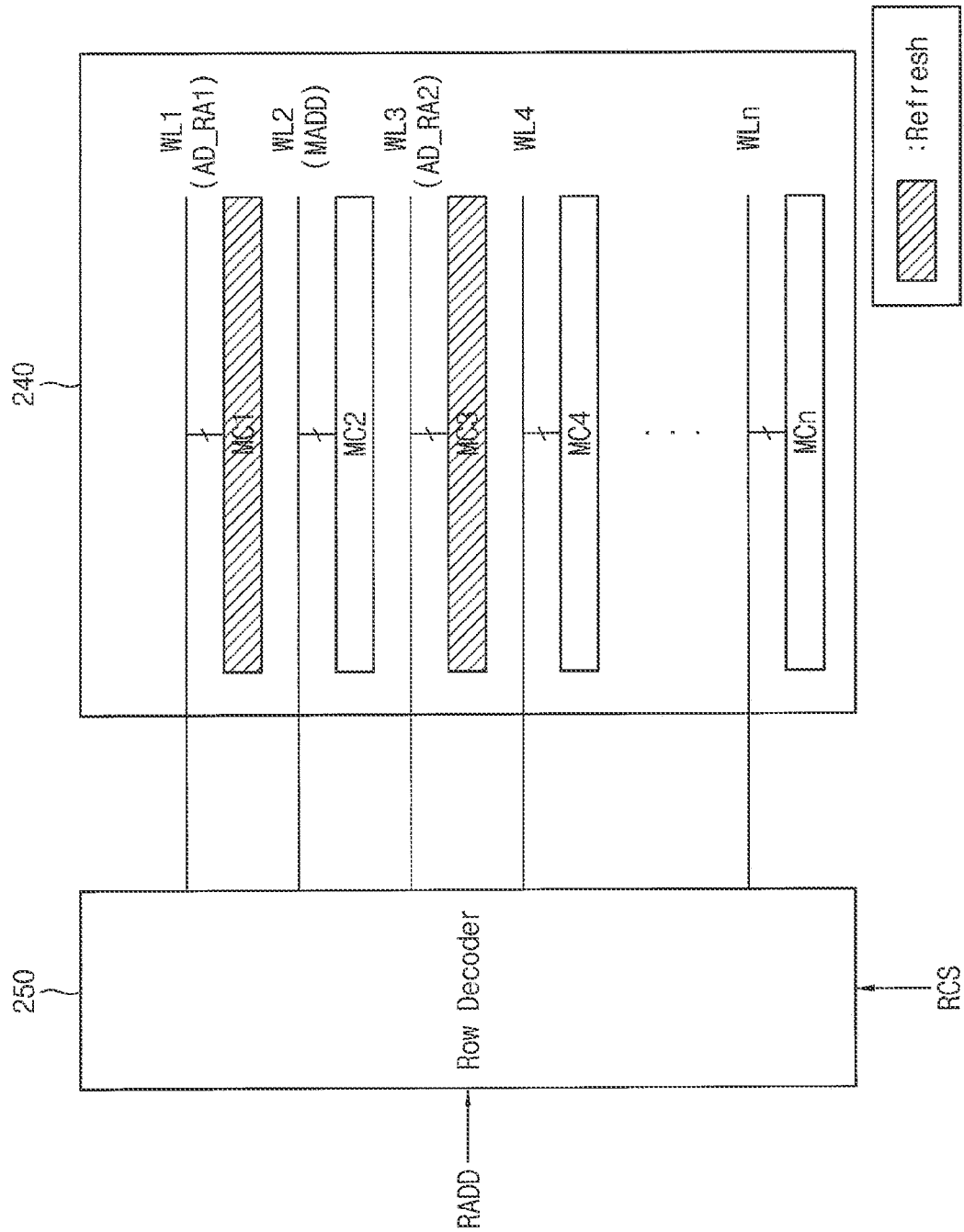
FIG. 9 illustrates an example of a row hammer refresh operation performed in the memory device according to an exemplary embodiment of the inventive concept.

FIG. 9 illustrates an example of a row hammer refresh operation performed in the memory device according to an exemplary embodiment of the inventive concept.

Referring to FIG. 9, the memory cell array 240 may be coupled to the row decoder 250 through first through n-th word-lines WL1~WLn, where n is an integer greater than four. The memory cell array 240 may include first through n-th memory cells MC1~MCn coupled to respective one of the first through n-th word-lines WL1~WLn. For example, the first memory cells MC1 may be coupled to the first word-line WL1 and the second memory cells MC2 may be coupled to the second word-line WL2.

The row decoder 250 may enable and disable a word-line corresponding to the refresh address RADD in response to the refresh control signal RCS. Therefore, the memory cells coupled to a word-line designated by the refresh address RADD may be refreshed.

As illustrated in FIG. 9, when an address corresponding to the second word-line WL2 is determined ass the maximum access address MADD, the refresh address RADD may include a first adjacent address AD_RA1 corresponding to the first word-line WL1 and a second adjacent address AD_RA2 corresponding to the third word-line WL3.

The row decoder 250 may enable the first word-line WL1 and the third word-line WL3. For example, the row decoder 250 may enable the third word-line WL3 after enabling the first word-line WL1. For example, the row decoder 250 may enable the first word-line WL1 after enabling the third word-line WL3. Since the first word-line WL1 and the third word-line WL3 are enabled, the first memory cells MC1 and the third memory cells MC3 are refreshed, and data stored in the first word-line WL1 and the third word-line WL3 are prevented from being lost due to the second word-line WL being frequently accessed.

Figure 10:
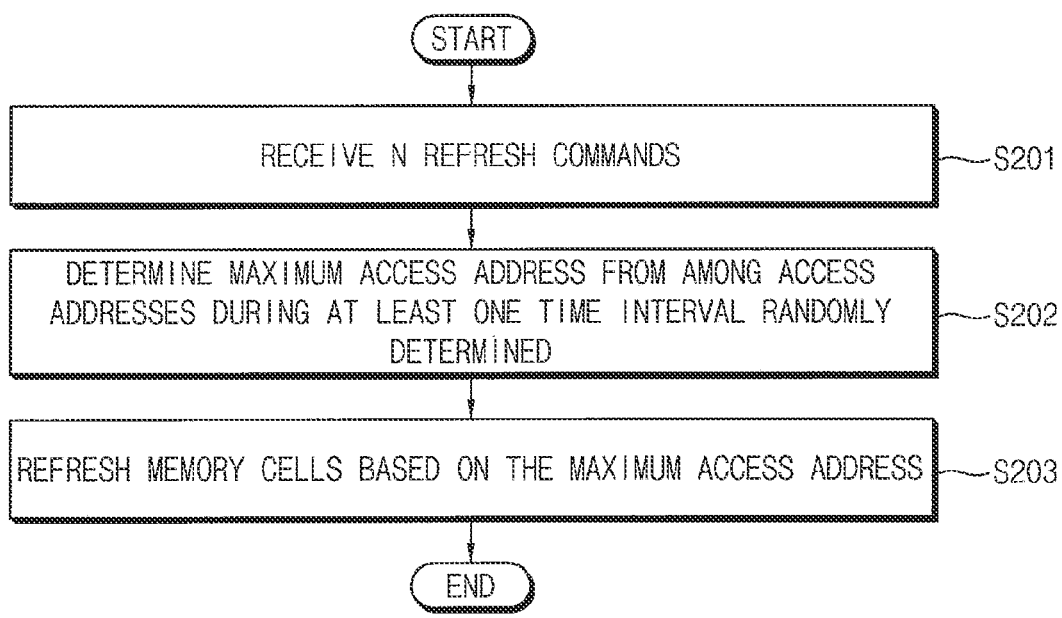
FIG. 10 is a flow chart illustrating a method of operating a memory device in FIG. 1 according to an exemplary embodiment of the inventive concept.

FIG. 10 is a flow chart illustrating a method of operating a memory device in FIG. 1 according to an exemplary embodiment of the inventive concept.

Referring to FIGS. 1 through 10, in operation S201, the memory device 200 receives N refresh commands REF. The N-th refresh command may be a row hammer refresh command designating a row hammer refresh operation.

In operation S202, the memory device 200 samples addresses accessed during a sampling period which is randomly determined in response to the N-th refresh command and determines a maximum access address from among the addresses accessed during the sampling period.

For example, the memory device 200 may generate a random binary code RBC having a predetermined number of bits in response to an active command ACT from the memory controller 100. The memory device 200 may compare the random binary code RBC and a reference binary code PBC to output the matching signal MTC based on a result of the comparison. The memory device 200 may determine a sampling period based on the matching signal MTC and the refresh command REF and may sample addresses accessed during the sampling period. The memory device 200 may determine a maximum access address, which is accessed most often or most frequently from among sampling addresses which are sampled during the sampling period. The memory device 200 may determine an address stored in a refresh register corresponding to a maximum counting value, from among refresh registers corresponding to counting values, respectively, as the maximum access address.

In operation S203, the memory device 200 refreshes memory cells based on the maximum access address. For example, the memory device 200 may refresh memory cells coupled to at least one second word-line adjacent to a first word-line corresponding to the maximum access address.

Figure 11:
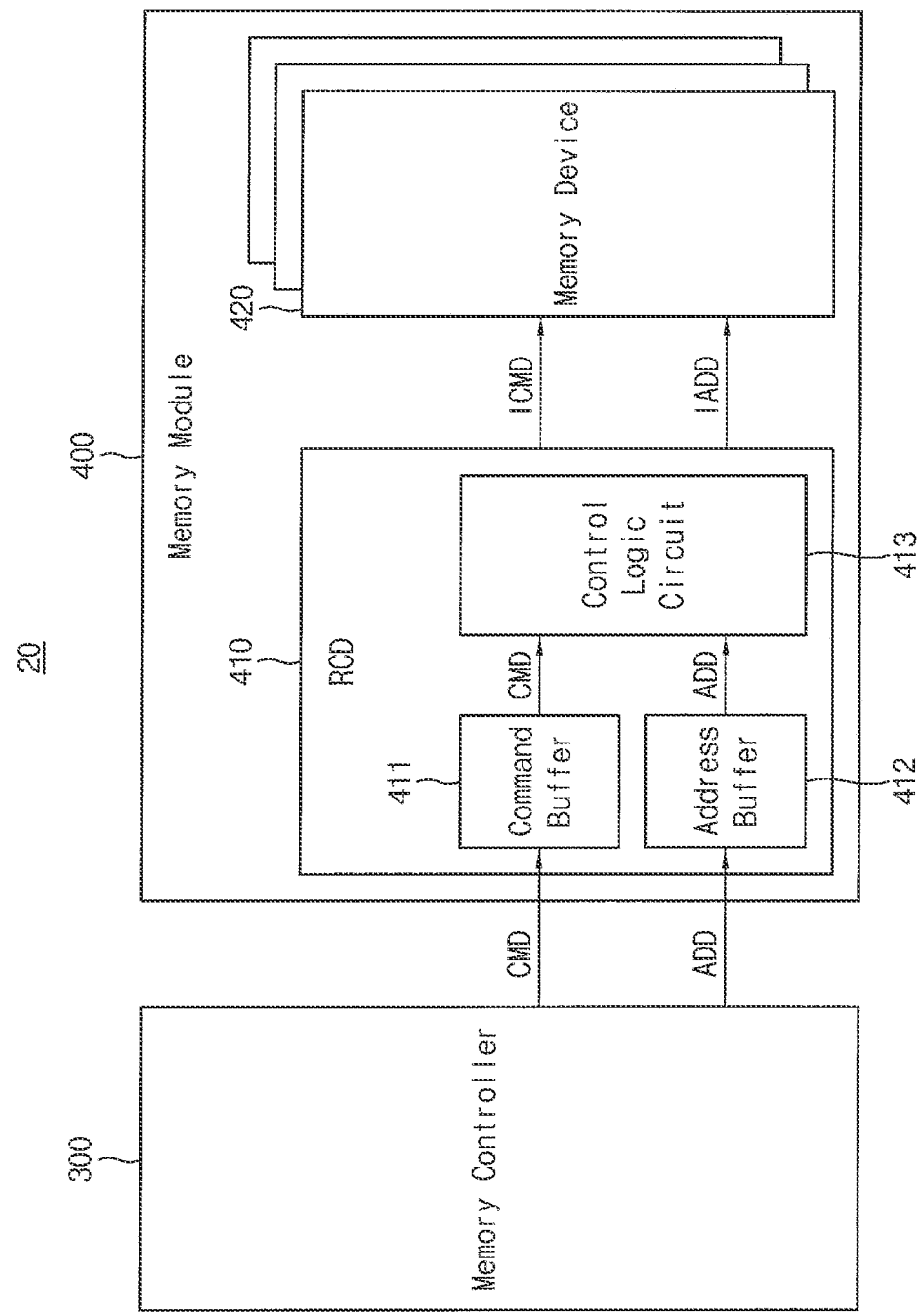
FIG. 11 is a block diagram illustrating an example of a memory system according to an exemplary embodiment of the inventive concept.

FIG. 11 is a block diagram illustrating an example of a memory system according to an exemplary embodiment of the inventive concept.

Referring to FIG. 11, a memory system 20 includes a memory controller 300 and a memory module 400.

For example, the memory system 20 may be one of various electronic devices such as a desktop computer, a laptop computer, a workstation, a server, a mobile device, etc. The memory controller 300 may correspond to the memory controller 100 in FIG. 1, and thus repeated description will be omitted.

The memory controller 200 may control the memory module 300. The memory controller 200 may transmit or issue a command CMD and an address ADD to the memory module for controlling the memory module 400.

The memory module 400 may operate based on the command CMD and the address ADD transmitted by the memory controller 300. The memory module 400 may store data transmitted from the memory controller 300 or may transmit data to the memory controller 300. The memory module 400 may include a register clock driver 410 and a memory device 420. The number of register clock drivers and the number of memory devices 420 are not limited to the example of FIG. 11, and the memory module 400 may include one or more register clock drivers and one or more memory devices.

The register clock driver 410 may be connected to one or more memory devices 420 to drive the one or more memory devices 420. The register clock driver 420 may buffer the command CMD and the address ADD received from the memory controller 300, and may transmit the buffered command CMD and the buffered address ADD to the memory devices 420.

The register clock driver 410 may include a command buffer 411 transmitting the command CMD to the memory devices 420 and an address buffer 412 transmitting the address ADD to the memory devices 420. The register clock driver 410 may output the command CMD from the command buffer 411 and the address ADD from the address buffer 412 to the memory device 420 as an internal command ICMD and an internal address IADD.

The register clock driver 410 may be a buffer chip for transmitting the command CMD and the address ADD of the memory controller 300 to the memory devices 420. The memory devices 420 may receive the internal command ICMD and the internal address IADD from the memory controller 300 through the register clock driver 410 instead of receiving the command CMD and the address ADD directly from the memory controller 300. The register clock driver 410 may improve signal integrity (SI) of the command CMD and the address ADD transmitted from the memory controller 300 to the memory devices 420.

The register clock driver 410 may further include a control logic circuit 413. The control logic circuit 413 may correspond to the control logic circuit 230 described with reference to FIGS. 1 through 10.

The control logic circuit 413 may generate the internal command ICMD and the internal address IADD associated with a row hammer refresh operation in response to a refresh command received through the command buffer 411. For example, the control logic circuit 413 may sample addresses accessed during a sampling period which is randomly determined, may determine a maximum access address based on sample addresses and may generate the internal address IADD based on the maximum access address.

The memory devices 420 may operate based on the internal command ICMD and the internal address IADD received from the register clock driver 410.

The memory devices 420 may perform a refresh operation based on the internal command ICMD and the internal address IADD associated with a normal refresh operation and/or a row hammer refresh operation. The memory devices 420 may employ the memory device 200 of FIG. 4. The memory devices 420 may include a memory cell array, a row decoder, a column decoder, a sense amplifier/write driver and a data I/O buffer. The memory devices 420 may refresh target memory cells in the memory cell array through the row hammer refresh operation. Therefore, the memory devices 420 may prevent data stored in the target memory cells from being lost due to a specified word-line being intensively accessed.

Figure 12:
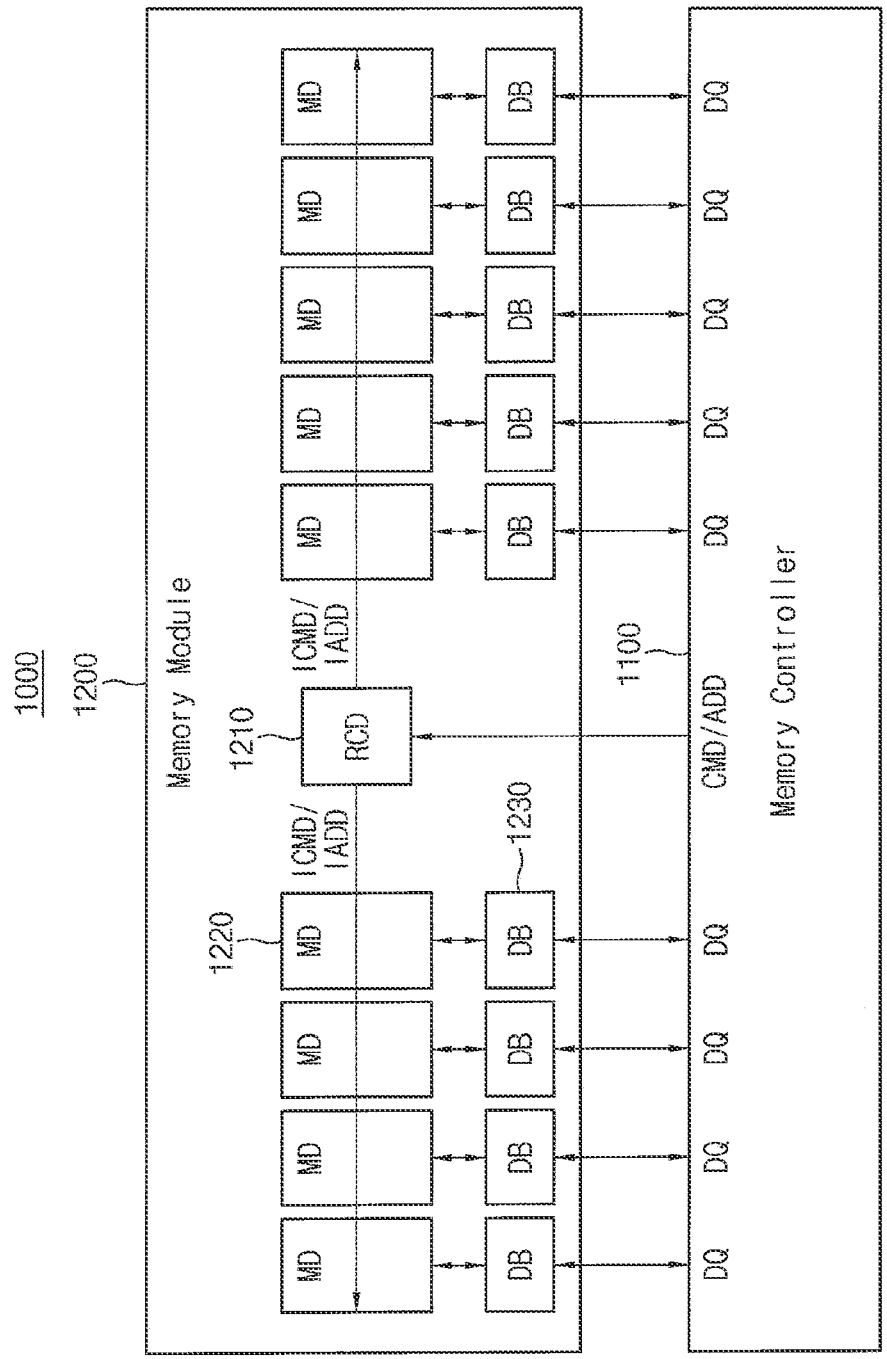
FIG. 12 is a block diagram illustrating an example of a memory system according to an exemplary embodiment of the inventive concept.

FIG. 12 is a block diagram illustrating an example of a memory system according to an exemplary embodiment of the inventive concept.

Referring to FIG. 12, a memory system 1000 may include a memory controller 1100 and a memory module 1200.

The memory module 1200 may include a register clock driver 1210, memory devices 1220, and data buffers 1230. The register clock driver 1210 may be implemented by using one of a SoC, an application specific integrated circuit (ASIC) and a field-programmable gate array (FPGA).

The register clock driver 1210 may receive the command CMD and the address ADD from the memory controller 1100. The register clock driver 1210 may transmit internal command ICMD and an internal address IADD to the memory devices 1220 based on the command CMD and the address ADD.

For example, the register clock driver 1210 may transmit the command CMD and the address ADD to the memory devices 1220 or generate the internal command ICMD and the internal address IADD based on the command CMD and the address ADD and transmit the internal command ICMD and the internal address IADD to the memory devices 1220.

For example, the register clock driver 1210 may correspond to the register clock driver 410 in FIG. 11. In this case, the register clock driver 1210 may generate the internal command ICMD and the internal address IADD associated with a row hammer refresh operation based on the command CMD and the address ADD.

Each of the memory devices 1220 may operate based on the internal command ICMD and the internal address IADD received from the register clock driver 1210.

Each of the memory devices 1220 may correspond to the memory device 200 in FIG. 1 or the memory device 400 in FIG. 11.

When each of the memory devices 1220 corresponds to the memory device 200 in FIG. 1, each of the memory devices 1220 may generate the refresh control signal RCS and the refresh address RADD associated with a row hammer refresh operation based on the internal command ICMD and the internal address IADD. Each of the memory devices 1220 may perform a row hammer refresh operation based on the refresh address RADD. When each of the memory devices 1220 corresponds to the memory device 420 in FIG. 11, each of the memory devices 1220 may perform a refresh operation based on the internal command ICMD and the internal address IADD.

The memory devices 1220 may share a path for receiving the internal command ICMD and the internal address IADD. In an exemplary embodiment, the memory devices disposed in a first side with respect to the register clock driver 1210 shares a first path for receiving the internal command ICMD and the internal address IADD and the memory devices disposed in a second side with respect to the register clock driver 1210 shares a second path for receiving the internal command ICMD and the internal address IADD. For example, the memory devices located to the left of the register clock driver 1210 may correspond to the memory devices in the first side and the memory devices to the right of the register clock driver 1210 may correspond to the memory devices in the right side.

Each of the memory devices 1220 may communicate data signals DQ with the memory controller 1100 through the data buffer 1230. Each of the memory devices 1220 may exchange data with the memory controller 1100 through the data buffer 1230. The memory devices 1220 may be accessed in parallel by the memory controller 1100. In FIG. 12, it is illustrated as the memory module 1200 including nine memory devices 1220, but embodiments of the inventive concept are not limited thereto.

Figure 13:
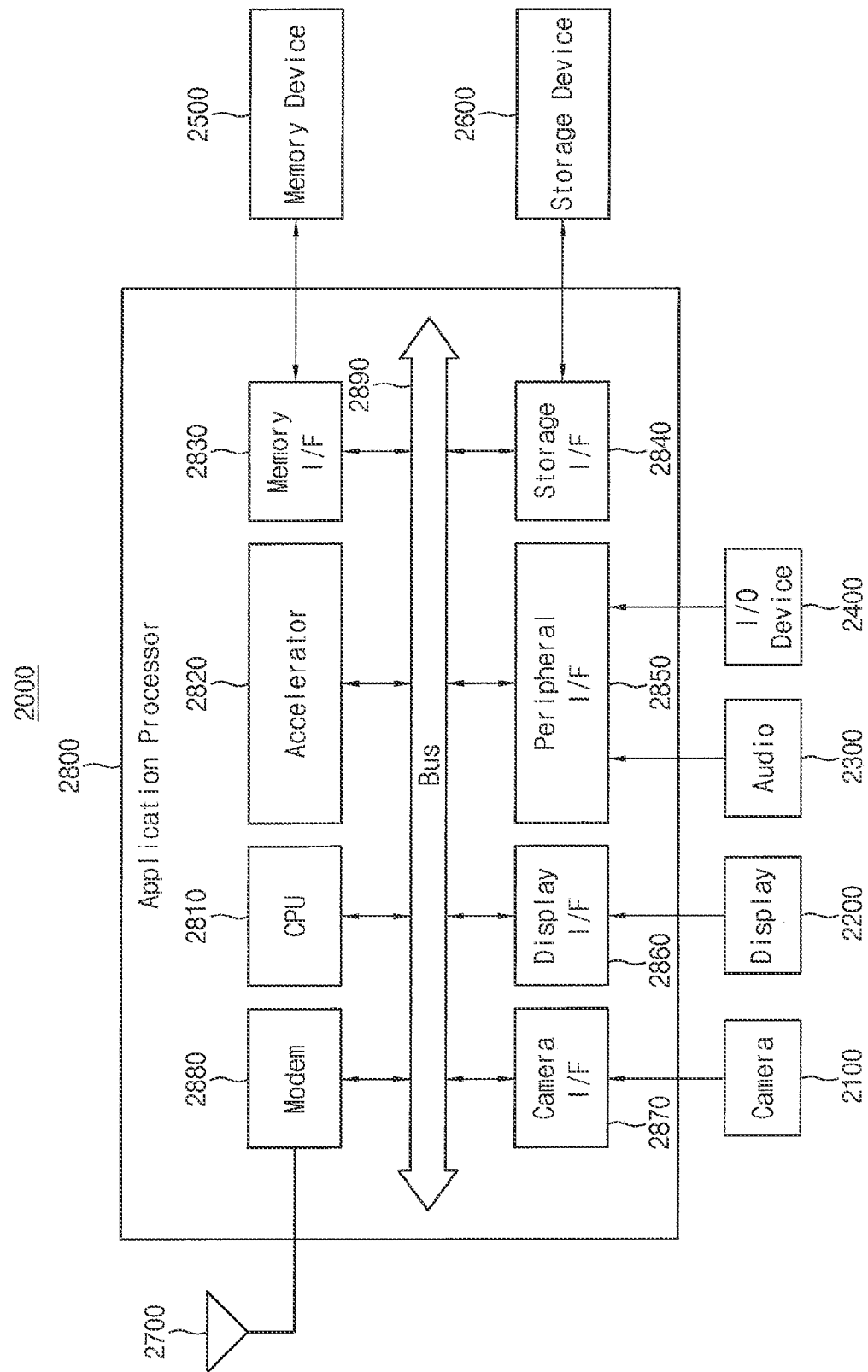
FIG. 13 is a block diagram illustrating an example of a mobile system according to an exemplary embodiment of the inventive concept.

FIG. 13 is a block diagram illustrating an example of a mobile system according to an exemplary embodiment of the inventive concept.

Referring to FIG. 13, a mobile system 2000 may include a camera 2100, a display 2200, an audio processor 2300, an I/O device 2400, a memory device 2500, a storage device 2600, an antenna 2700 and an application processor (AP) 2800.

The mobile system 2000 may be implemented with one of a laptop computer, a portable terminal, a smart phone, a tablet personal computer (PC), a wearable device, a healthcare device and internet of things (IoT). In addition, the mobile system 2000 may be implemented with a server or a PC.

The camera 2100 may capture an image or a video under control of a user. The camera 2100 may communicate with the AP 2800 through a camera interface (I/F) 2870.

The display 2200 may include, for example, a liquid crystal display (LCD), an organic light emitting diode (OLED) display, an active matrix (AM)-OLED, or a plasma display panel (PDP). The display 2200 may receive input signals through a user's touch and may be used as an input device of the mobile system 2000. The display 2200 may communicate with the AP 2800 through a display I/F 2860.

The audio processor 2300 may process audio data in contents transferred from the memory device 2500 or the storage device 2600. The audio processor 2300 may perform encoding/decoding or noise filtering on the audio data.

The I/O device 2400 may include various devices that provide a digital input and/or digital output such as a device to generate signal based on input of the user, a universal serial bus (USB), a digital camera, a secure digital (SD) card, a digital versatile disc (DVD) or a network adaptor. The audio processor 2300 and the I/O device 2400 may communicate with the AP 2800 through a peripheral I/F 2850.

The AP 2800 may control overall operation of the mobile system 2000 through a central processing unit (CPU) 2810.

The AP 2800 may control the display 2200 to display a portion of the contents stored in the storage device 2600. In addition, when a user's input is received through the I/O device 2400, the AP 2800 may perform control operation corresponding to the user's input. The AP 2800 may include a bus 2890 through which a modem 2880, the CPU 2810, an accelerator 2820, a memory I/F 2830, a storage I/F 2840, the peripheral I/F 2850, the display I/F 2860 and the camera I/F are connected to each other.

The AP 2800 may be implemented with an SoC to run an operating system (OS). The AP 2800, a memory device 2500 and the storage device 2600 may be implemented by using packages such as package on package (PoP), ball gridarrays (BGAs), chip scale packages (CSPs), system in package (SIP), multi-chip package (MCP), wafer-level fabricated package (WFP), and wafer-level processed stack package (WSP), etc.

The AP 2800 may further include an accelerator 2820. The accelerator 2820 may be a function block to perform a specified function. The accelerator 2820 may include a graphic processing unit (GPU) to process graphic data or a neural processing unit (NPU) to perform an artificial neural network operation such as training and/or inference.

The AP 2800 may include a modem 2880 or a modem chip disposed in an outside of the AP 2800. The modem 2880 receives and/or transmits wireless data through an antenna 2700, modulates signals to be transmitted to the antenna 2700 and demodulates signals received from the antenna 2700.

The AP 2800 may include a memory I/F 2830 to communicate with the memory device 2500. The memory I/F 2830 may include a memory controller to control the memory device 2500 and the memory device 2500 may be directly connected to the AP 2800. The memory controller in the memory I/F 2830 may control the memory device 2500 by changing read/write instructions from the CPU 2810, the accelerator 2820 or the modem 2880 to commands for controlling the memory device 2500.

The AP 2800 may communicate with the memory device 2500 through a predefined interface protocol. The AP 2800 may communicate with the memory device 2500 through an interface protocol such as LPDDR4 or LPDDR5 conformed to JEDEC standards. The AP 2800 may communicate with the memory device 2500 through an interface protocol such as HBM, HMC or Wide I/O conformed to high bandwidth JEDEC standards.

For example, the memory device 2500 may be implemented with a DRAM device, but exemplary embodiments of the inventive concept are not limited thereto. The memory device 2500 may include memory cells of SRAM, PRAM, MRAM, FRAM, a hybrid RAM, and a NAND flash memory.

The memory device 2500 may have a relatively smaller latency and bandwidth than the I/O device 2400 and the storage device 2600. The memory device 2500 may be initialized at a timing of power on of the mobile system 2000 and an OS and application data are loaded into the memory device 2500. The memory device 2500 may be used for temporarily storing the OS and application data or a space for executing software.

In exemplary embodiments, the memory device 2500 may correspond to the memory device 200 described with reference to FIGS. 1 through 10. For example, the memory device 2500 may sample addresses accessed during a sampling period which is randomly determined based on the command and the address from the memory controller in the AP 2800, may determine a maximum access address based on sample addresses and may perform a row hammer refresh operation based on the maximum access address.

The AP 2800 may include a storage I/F 2840 to communicate with the storage device 2600 and the storage device 2600 may be directly connected to the AP 2800. The storage device 2600 may be provided as a separate chip and the AP 2800 and the storage device 2600 may be fabricated into one package. The storage device 2600 may be implemented with a NAND flash memory, but example embodiments are not limited thereto.

While the present disclosure has been particularly shown and described with reference to the exemplary embodiments thereof, it will be understood by those of ordinary skill in the art that various changes in form and detail may be made therein without departing from the spirit and scope of the present disclosure.

What is claimed is:

1. A memory device comprising:
   a memory cell array including a plurality of memory cells coupled to a plurality of word-lines;
   a random bit generator configured to generate a random binary code having a predetermined number of bits;
   a comparator configured to compare the random binary code and a reference binary code to output a matching signal indicating whether the random binary code matches the reference binary code; and
   a refresh controller configured to sample addresses accessed by a memory controller in response to a refresh command from the memory controller until the matching signal indicates the random binary code matches the reference binary code during a sampling period to generate a plurality of sampling addresses, select one of the plurality of sampling addresses, and refresh target memory cells from among the plurality of memory cells based on the selected sampling address.

2. The memory device of claim 1, wherein the random bit generator is configured to output the random binary code in response to an active command provided from the memory controller.

3. The memory device of claim 1, wherein the random bit generator is configured to output the random binary code based on a pseudo random sequence.

4. The memory device of claim 1, wherein the refresh command corresponds to an N-th refresh command from among N refresh commands provided from the memory controller and N is an integer greater than one.

5. The memory device of claim 1, wherein the refresh controller is configured to generate a refresh control signal for refreshing the target memory cells in response to the refresh command.

6. The memory device of claim 1, wherein the refresh controller is configured to determine a maximum access address accessed most often from among the sampling addresses and the selected one sampling address is the maximum access address.

7. The memory device of claim 6, further comprising:
   a refresh register circuit including a plurality of refresh registers configured to store the addresses accessed during the sampling period,
   wherein the refresh controller is configured to determine an address stored in a refresh register corresponding to a maximum counting value, from among the refresh registers corresponding to counting values, respectively, as the maximum access address.

8. The memory device of claim 6, wherein the maximum access address designates a first word-line from among the plurality of word-lines and the refresh address designates at least a second word-line adjacent to the first word-line, from among the plurality of word-lines.

9. The memory device of claim 1, wherein the sampling period is determined as a time period between a time point at which the refresh controller receives the refresh command and a time point at which the comparator outputs the matching signal.

10. A memory device comprising:
    a memory cell array including a plurality of memory cells coupled to a plurality of word-lines;
    a control logic circuit configured to determine a first duration of a first sampling period based on a first random value in response a first refresh command, determine a second duration of a second sampling period based on a second random value in response to a second refresh command, generate a refresh address based on first sampling addresses and second sampling addresses, the first sampling addresses accessed by a memory controller during the first sampling period, the second sampling addresses accessed by the memory controller during the second sampling period; and
a row decoder configured to refresh target memory cells corresponding to the refresh address, from among the plurality of memory cells,
wherein the first sampling period is determined based on a first refresh command from the memory controller and a first matching signal that is randomly generated.

11. The memory device of claim 10, wherein a number of the first sampling addresses is different from a number of the second sampling addresses.

12. The memory device of claim 10, wherein the control logic circuit is configured to determine a maximum access address designating a first word-line from among the plurality of word-lines, from among the first sampling addresses and the second sampling addresses and configured to generate the refresh address designating at least one second word-line adjacent to the first word-line, from among the plurality of word-lines, and
wherein the maximum access address is accessed most often from among the first sampling addresses and the second sampling addresses.

13. The memory device of claim 12, wherein the control logic circuit includes a refresh register circuit including a plurality of refresh registers configured to store the first sampling addresses and the second sampling addresses, and
wherein the control logic circuit is configured to determine an address stored in a refresh register corresponding to a maximum counting value, from among the refresh registers corresponding to counting values, respectively, as the maximum access address.

14. The memory device of claim 10, wherein the control logic circuit is configured to receive a first refresh command and a second refresh command from the memory controller and is configured to generate the refresh address in response to a third refresh command which the control logic circuit receives from the memory controller after receiving the first refresh command and the second refresh command.

15. The memory device of claim 10, wherein the control logic circuit comprises:
a random bit generator configured to generate a random binary code having a predetermined number of bits;
a comparator configured to compare the random binary code and a reference binary code to output a matching signal based on a result of the comparison; and
a refresh controller configured to determine the first sampling period and the second sampling period based on the matching signal and a refresh command from the memory controller.

16. A method of operating a memory device including a plurality of memory cells coupled to a plurality of word-lines, the method comprising:
performing a first sampling for sampling addresses provided from a memory controller in response to a first refresh command to generate first sample addresses;
halting the first sampling when a first code randomly generated after receiving the first refresh command matches a reference code;
refreshing first memory cells from among the plurality of memory cells based on a second refresh command and one of the first sample addresses, the second refresh command being provided from the memory controller after the first matching signal code is generated;
performing a second sampling for sampling addresses provided from the memory controller in response to the second refresh command to generate second sample addresses;
halting the second sampling when a second code that is randomly generated after receiving the second refresh command matches a reference code; and
refreshing second memory cells from among the plurality of memory cells based on a third refresh command and one of the first sample addresses and the second sample addresses, the third refresh command being provided from the memory controller after the second code is generated.

17. The method of claim 16, wherein each of the first code and the second code is generated based on a pseudo random sequence, in response to an active command provided from the memory controller.

18. The method of claim 16, wherein a number of the first sample addresses is different from a number of the second sample addresses.

19. The method of claim 16, wherein a first time period between a time point at which the memory device receives the first refresh command and a time point at which the first code is generated is different from a second time period between a time point at which the memory device receives the second refresh command and a time point at which the second code is generated.

20. The method of claim 16, wherein the first memory cells are different from the second memory cells.

* * * * *